(12) United States Patent
Snider et al.

(10) Patent No.: US 7,307,448 B2
(45) Date of Patent: Dec. 11, 2007

(54) INTERCONNECTABLE NANOSCALE COMPUTATIONAL STAGES

(75) Inventors: Gregory S. Snider, Mountain View, CA (US); Philip J. Kuekes, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 72 days.

(21) Appl. No.: 11/136,935

(22) Filed: May 24, 2005

(65) Prior Publication Data

US 2006/0266999 A1 Nov. 30, 2006

(51) Int. Cl.
*H03K 19/173* (2006.01)
(52) U.S. Cl. .......................... 326/38; 977/938
(58) Field of Classification Search ............ 326/37–41, 326/46, 93; 977/932, 938
See application file for complete search history.

(56) References Cited

U.S. PATENT DOCUMENTS

| | | | | |
|---|---|---|---|---|
| 6,417,711 | B2 * | 7/2002 | Fulkerson | 327/203 |
| 6,586,965 | B2 * | 7/2003 | Kuekes | 326/37 |
| 6,777,982 | B2 * | 8/2004 | Goldstein et al. | 326/134 |
| 7,073,157 | B2 * | 7/2006 | DeHon et al. | 716/17 |

OTHER PUBLICATIONS

Leiserson, Charles E., et al., "Retiming Synchronous Circuitry," digital; Systems Research Center, Aug. 20, 1986.
Touati, H.J., et al., "Computing the initial states of retimed circuits," computer-Aided Design of Integrated Circuits and Systems, IEEE Transactions on, Jan. 1993.
Eckl, Klaus, et al., "A Practical Approach to Multiple-Class Retiming," 1999, no month.
Singhal, Vigyan, et al., "The Case for Retiming with Explicit Reset Circuitry," ICCAD 1996, no month.
Papaefthymiou, Marios C., "Understanding retiming through maximum average-weight cycles," ACM Symposiusm, 1991, no month.
Kundu, Sandip, et al., "A Small Test Generator for Large Designs," IEEE, 1992.

* cited by examiner

*Primary Examiner*—Don Le

(57) ABSTRACT

Embodiments of the present invention implement computing circuits comprising a number of interconnectable nanoscale computational stages. Each nanoscale computational stage includes: (1) a nanoscale logic array; and (2) a number of nanoscale latch arrays interconnected with the configurable logic array. Each nanoscale computational stage receives signals and passes the signals through the nanoscale logic array and to a nanoscale latch array. Signals output from the nanoscale latch array can be routed to another nanoscale computational stage or out of the computing circuit.

36 Claims, 23 Drawing Sheets

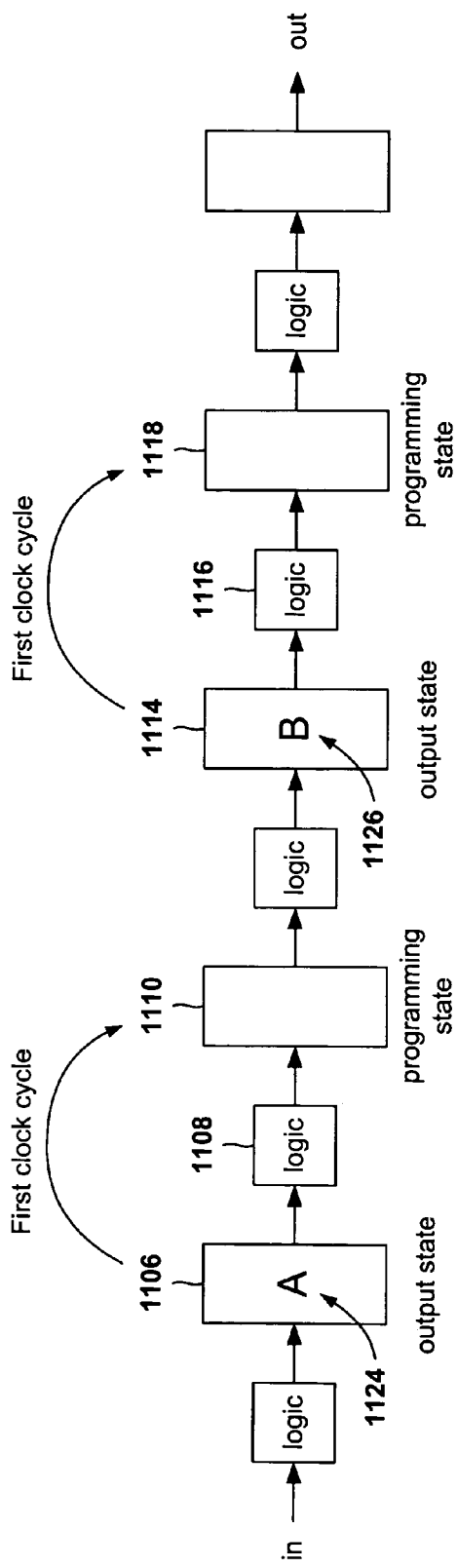
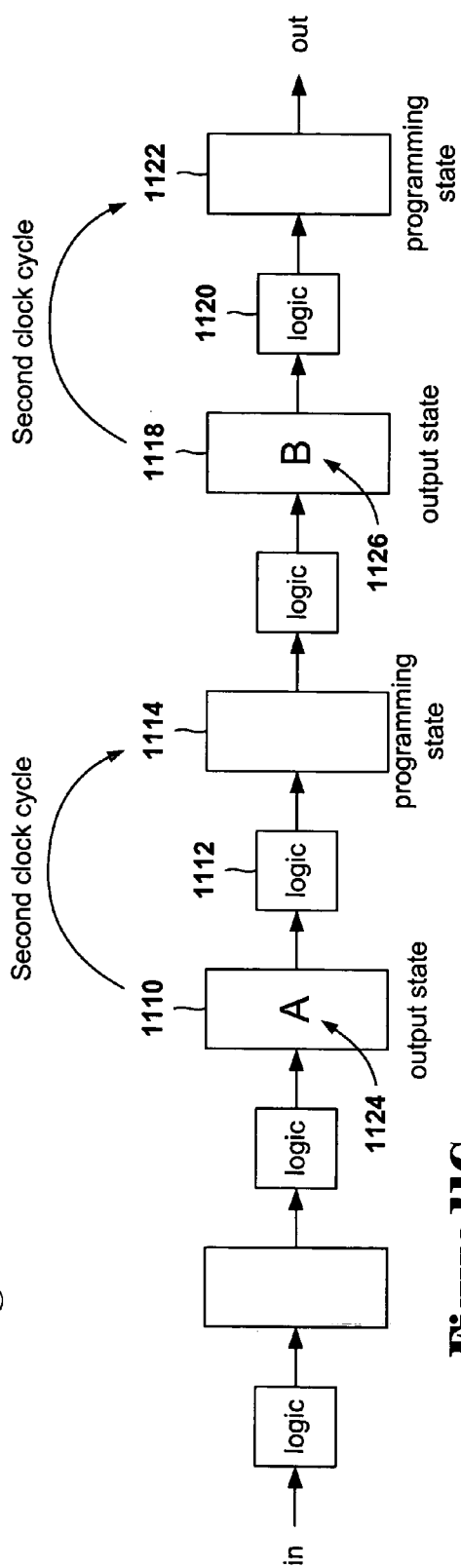
Figure 11B
Figure 11C

Clock Cycle 5
B A = 0 1

Clock Cycle 6

Clock Cycle 7
B A = 1 0

Clock Cycle 8

INTERCONNECTABLE NANOSCALE COMPUTATIONAL STAGES

TECHNICAL FIELD

The present invention relates to electronic devices, and, in particular, to interconnectable nanoscale computational stages for performing computations.

BACKGROUND OF THE INVENTION

During the past fifty years, the electronics and computing industries have been relentlessly propelled forward by ever decreasing sizes of basic electronic components, such as transistors and signal lines, and by correspondingly ever increasing component densities of integrated circuits, including processors and electronic memory chips. Eventually, however, it is expected that fundamental component-size limits will be reached in semiconductor-circuit-fabrication technologies based on photolithographic methods. As the size of components decreases below the resolution limit of ultraviolet light, for example, far more technically demanding and expensive higher-energy-radiation-based technologies need to be employed to create smaller components using photolithographic techniques. Expensive semiconductor fabrication facilities may need to be rebuilt in order to use the new techniques. Many new obstacles are also expected to be encountered. For example, it is necessary to fabricate semiconductor devices through a series of photolithographic steps, with precise alignment of the masks used in each step with respect to the components already fabricated on the surface of a nascent semiconductor. As the component sizes decrease, precise alignment becomes more and more difficult and expensive. As another example, the probabilities that certain types of randomly distributed defects in semiconductor surfaces result in defective semiconductor devices may increase as the sizes of components manufactured on the semiconductor surfaces decrease, resulting in an increasing proportion of defective devices during manufacture, and a correspondingly lower yield of useful product. Ultimately, various quantum effects that arise only at molecular-scale distances may altogether overwhelm current approaches to component fabrication in semiconductors.

In view of these problems, researchers and developers have expended considerable research effort in fabricating sub-microscale and nanoscale electronic devices using alternative technologies. Nanoscale electronic devices generally employ nanoscale signal lines having widths, and nanoscale components having dimensions, of less than 100 nanometers. More densely fabricated nanoscale electronic devices may employ nanoscale signal lines having widths, and nanoscale components having dimensions, of less than 50 nanometers, and, in certain types of devices, less than 10 nanometers. A nanoscale electronic device may include sub-microscale, microscale, and larger signal lines and components.

Although general nanowire technologies have been developed, it is not necessarily straightforward to employ nanowire technologies to miniaturize existing types of circuits and structures. While it may be possible to tediously construct miniaturized, nanowire circuits similar to the much larger, current circuits, it is impractical, and often impossible, to manufacture such miniaturized circuits using current technologies. Even were such straightforwardly miniaturized circuits able to be feasibly manufactured, the much higher component densities that ensue from combining together nanoscale components necessitate much different strategies related to removing waste heat produced by the circuits. In addition, the electronic properties of substances may change dramatically at nanoscale dimensions, so that different types of approaches and substances may need to be employed for fabricating even relatively simple, well-known circuits and subsystems at nanoscale dimensions. Thus, new implementation strategies and techniques need to be employed to develop and manufacture useful circuits and structures at nanoscale dimensions using nanowires.

Digital electronic systems, such as synchronous pipelines and state machines, are generally described as collections of logic functions and memory functions that implement complex computations. Synchronous pipelines and state machines commonly store logical-variable values in memory and subsequently reuse stored logical-variable values as inputs for logic functions. Latches can be employed for storing logical-variable values and outputting the stored logical-variable values in either true or inverted form. Although microscale latches and logic are well-known in the art of general computing, the design and manufacture of nanoscale circuits combining nanoscale latches and logic present numerous challenges. Therefore, designers, manufacturers, and users of nanoscale logic devices have recognized the need for methods of combining nanoscale latches and nanoscale logic into circuits that implement complex computations.

SUMMARY OF THE INVENTION

Embodiments of the present invention implement computing circuits comprising a number of interconnectable nanoscale computational stages. Each nanoscale computational stage includes: (1) a nanoscale logic array; and (2) a number of nanoscale latch arrays interconnected with the configurable logic array. Each nanoscale computational stage receives signals and passes the signals through the nanoscale logic array and to a nanoscale latch array. Signals output from the nanoscale latch array can be routed to another nanoscale computational stage or out of the computing circuit.

BRIEF DESCRIPTION OF THE DRAWINGS

FIGS. 11B-11C illustrate signal transmission during two consecutive hypothetical clock cycles in the exemplary pipeline shown in FIG. 11A.

DETAILED DESCRIPTION OF THE INVENTION

In various embodiments of the present invention, complex computations are broken up into a series of discrete smaller computational stages. Each computational stage is performed by a synchronous computational stage that utilizes nanowire-crossbar-based logic arrays and latch arrays. Within each synchronous computational stage, input signals are passed through logic arrays and temporarily stored in latch arrays. Stored signals are subsequently output in restored-strength true or inverted forms, and routed by switch arrays to output signal lines or to other computational stages for further computations. Various embodiments of the present invention are directed to implementing synchronous nanowire-crossbar pipelines by interconnecting synchronous pipeline computational stages and implementing synchronous nanowire-crossbar state machines by interconnecting synchronous state machine computational stages.

The present invention is described below in the following four subsections: (1) an overview of nanowire crossbars; (2) an overview of nanowire-crossbar-based logic arrays, latch arrays, and switch arrays; (3) an overview of pipelines and state machines; and (4) implementation of synchronous nanowire-crossbar pipelines and state machines.

Overview of Nanowire Crossbars

Figure 1:
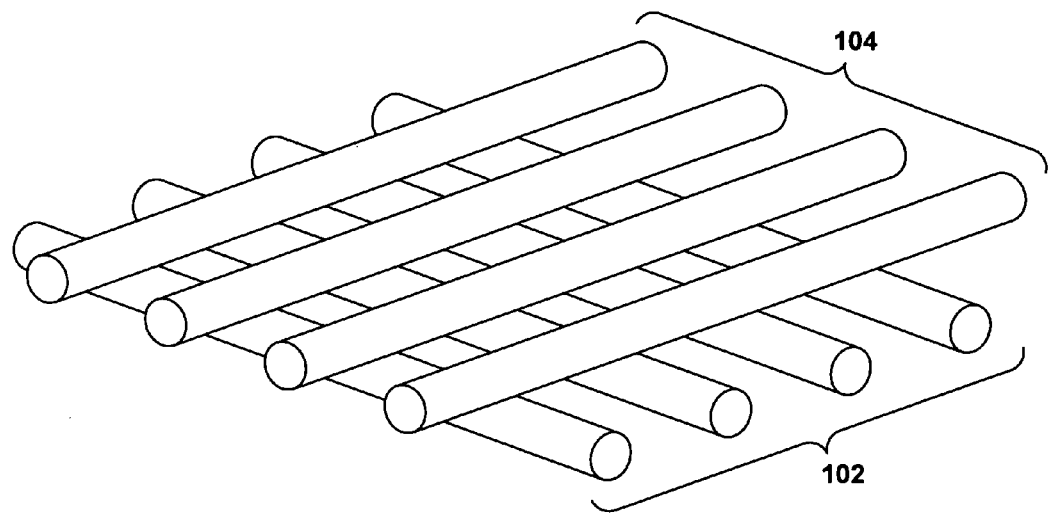
FIG. 1 illustrates an exemplary nanowire crossbar.

A relatively new and promising technology for manufacturing electronic devices involves nanowire crossbars. FIG. 1 illustrates an exemplary nanowire crossbar. In FIG. 1, a first layer of approximately parallel nanowires 102 is overlain by a second layer of approximately parallel nanowires 104 roughly perpendicular, in orientation, to the nanowires of the first layer 102, although the orientation angle between the layers may vary. The two layers of nanowires form a lattice, or crossbar, each nanowire of the second layer 104 overlying all of the nanowires of the first layer 102 and coming into close contact with each nanowire of the first layer 102, at intersections that represent the closest contact between two nanowires. Note that the term "nanowire crossbar" may refer to crossbars having one or more layers of sub-microscale, microscale, or larger wires in addition to nanowires.

Nanowires can be fabricated using mechanical nanoprinting techniques. Alternatively, nanowires can be chemically synthesized and can be deposited as layers of nanowires in one or a few process steps. Other alternative techniques for fabricating nanowires may also be employed. Thus, a two-layer nanowire crossbar comprising first and second layers, as shown in FIG. 1, can be manufactured by any of numerous relatively straightforward processes. Many different types of conductive and semi-conductive nanowires can be chemically synthesized from metallic and semiconductor substances, from combinations of these types of substances, and from other types of substances. A nanowire crossbar may be connected to microscale signal-line leads or other electronic leads through a variety of different methods to incorporate the nanowires into electrical circuits.

Figure 2:
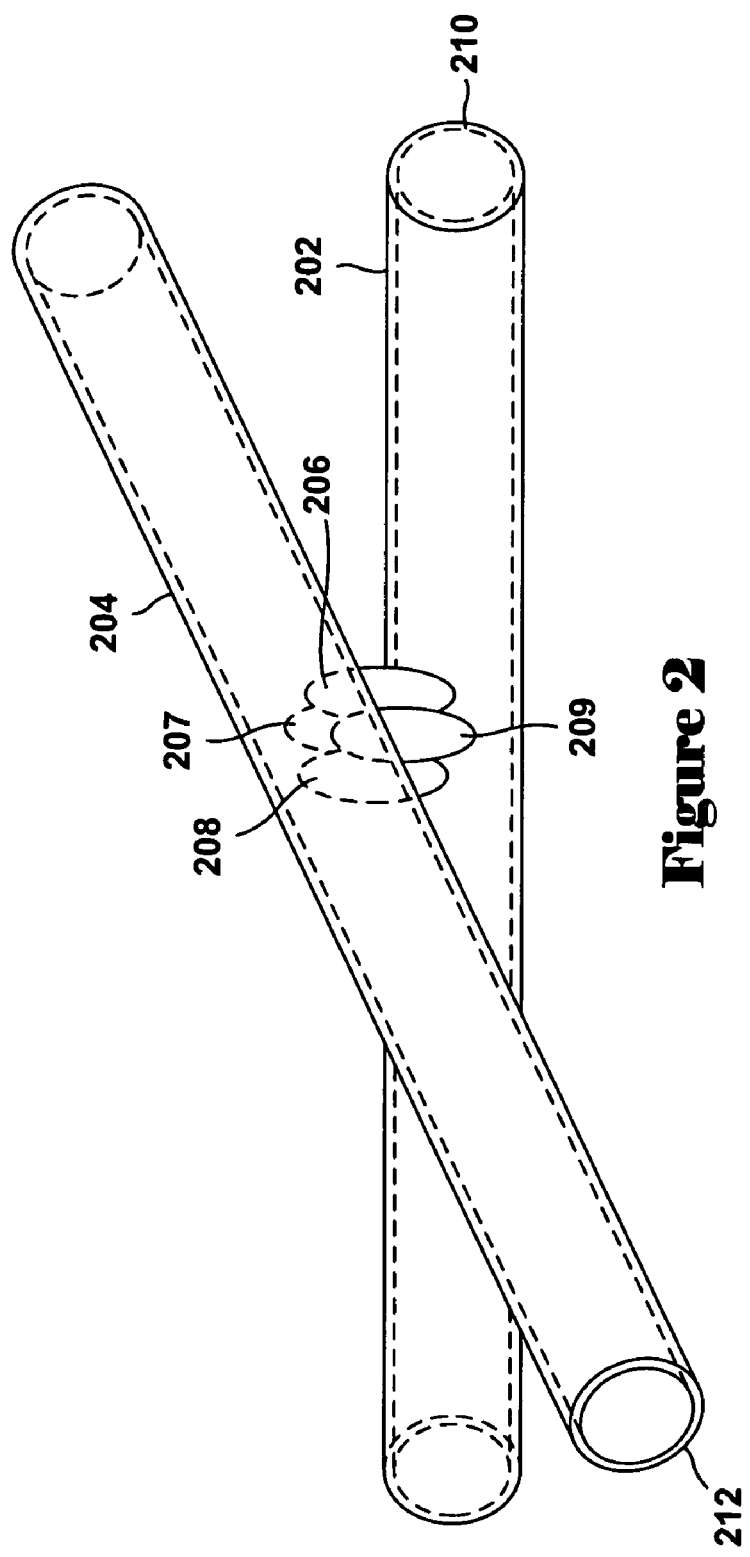
FIG. 2 illustrates a nanowire junction at an intersection between two roughly orthogonal nanowires.

Nanowire crossbars may be used to create arrays of nanoscale electronic components, such as transistors, diodes, resistors, and other familiar basic electronic components. FIG. 2 illustrates a nanowire junction at an intersection between two roughly orthogonal nanowires. In FIG. 2, the nanowire junction interconnects nanowires 202 and 204 of two contiguous layers within a nanowire crossbar. Note that the nanowire junction may or may not involve physical contact between the two nanowires 202 and 204. As shown in FIG. 2, the two nanowires are not in physical contact at their overlap point, but the gap between them is spanned by a small number of molecules 206-209. Various different types of molecules may be introduced at nanowire junctions for a variety of different purposes. In many cases, the molecules of a nanowire junction may be accessed, for various purposes, through different voltage levels or current levels placed on the nanowires forming the nanowire junction. The molecules spanning the nanowire junction in FIG. 2 may have various different quantum states in which the molecules exhibit resistive, semiconductor-like, or conductive electrical properties. The current passing between the two nanowires interconnected by a nanowire junction may be a nonlinear function of the voltage across the nanowire junction as a result of quantum-mechanical tunneling of electrons through relatively low-energy, unoccupied quantum states of the molecules. The quantum states, and relative energies of quantum states, of the molecules may be controlled by applying differential currents or voltages to the nanowires forming the interaction. For example, molecules may be conductive in a reduced state, but may act as insulators in an oxidized state, with redox reactions controlled by voltage levels determining which of the quantum states the molecules inhabit.

In general, a nanowire junction is anisotropic, having a polarity or direction with respect to physical properties, including electrical properties. This anisotropy may arise from different chemical and/or physical properties of nanowires in the two layers of a nanowire crossbar, may arise from asymmetries of nanowire-junction molecules, and uniform orientation of the nanowire-junction molecule with respect to the nanowire layers, and may arise both from differences in the properties of the nanowires as well as nanowire-junction-molecule asymmetries. The fact that nanowire junctions may have polarities allows for controlling nanowire junction properties by applying positive and negative voltages to nanowire junctions, eliciting forward and reverse currents within the nanowire junctions.

As shown in FIG. 2, the nanowires may include outer coatings, such as outer coatings 210 and 212. The outer coatings may serve to insulate nanowires from one another, may constitute the molecules that serve to span nanowire junctions when the nanowires are placed in contact with one another, and/or may serve as modulation-dopant-layers, which can be selectively activated to dope semiconductor nanowires. Both p-type and n-type modulation dopant coatings have been developed. In other applications, the molecules spanning nanowire junctions between overlapping nanowires may be introduced as a separate layer formed between layers of nanowires. In some cases, the state changes of nanowire-junction molecules may not be reversible. For example, the nanowire-junction molecules may initially be resistive, and may be made conductive through application of relatively high voltages. In other cases, the nanowire-junction molecules may be conductive, but the molecules may be irreversibly damaged, along with portions of the nanowires proximal to the nanowire junctions, through application of very high voltage levels, resulting in disrupting conductivity between the two nanowires and breaking electrical connection between them. In yet other cases, the nanowire-junction molecules may transition reversibly from one state to another and back, so that the nanoscale electrical components configured at nanowire junctions may be reconfigured, or programmed, by application of differential voltages to selected nanowire junctions.

One type of nanowire junction that can be configured behaves as if it were a resistor in series with a switch that may be opened or closed. When the switch is closed, the nanowire-junction molecule connects the overlapping nanowires at the nanowire junction. When the switch is open, the nanowire junction molecule spanning the nanowire junction has no effect on the current.

Figure 3A:
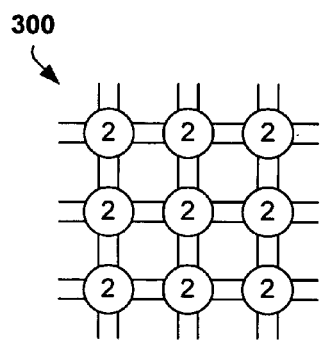
FIGS. 3A-3D illustrate one possible approach for configuring a network of nanoscale electrical components from a two-layer nanowire crossbar.
Figure 3B:
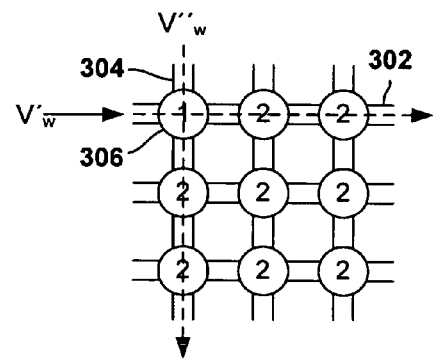
Figure 3C:
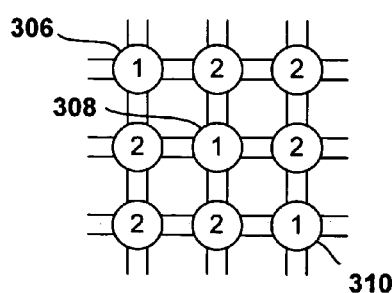
Figure 3D:
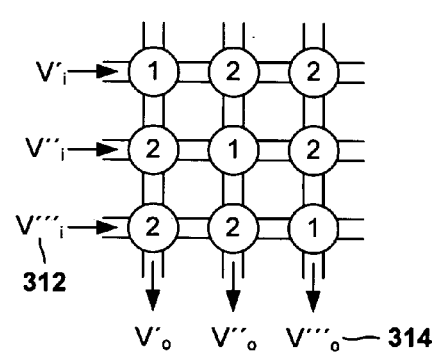

Nanowire junctions can be configured electrically, optically, mechanically or by other means. FIG. 3 illustrates one possible approach to configuring a network of reconfigurable nanoscale electrical components from a two-layer nanowire crossbar. In FIGS. 3A-3D, a small 3×3 nanowire crossbar is shown, with circles at all nine nanowire junctions that indicate the state of the nanowire-junction molecules. In one state, labeled "1" in FIGS. 3A-3D, the nanowire-junction molecules may have certain semiconductor, or conductive properties, while in a second state, labeled "2" in FIGS. 3A-3D, nanowire-junction molecules may have different properties. Initially, as shown in FIG. 3A, the states of the nanowire junctions of the nanowire crossbar 300 are in the state labeled "2." Next, as shown in FIG. 3B, each nanowire junction may be uniquely accessed by applying a WRITE voltage, or configuring voltage, to the nanowires that form the nanowire junction in order to configure, or program, the nanowire junction to have the state "1." For example, in FIG. 3B, a first WRITE voltage $v_w'$ is applied to horizontal nanowire 302 and a second WRITE voltage $v_w''$ is applied to vertical nanowire 304 to change the state of the nanowire junction 306 from "2" to "1." Individual nanowire junctions may be configured through steps similar to the steps shown in FIG. 3B, resulting finally in a fully configured nanoscale component network as shown in FIG. 3C. Note that, in FIG. 3C, the states of nanowire junctions 306, 308, and 310, forming a downward-slanted diagonal through the nanowire crossbar, have been configured by selective application of WRITE voltages. Finally, as shown in FIG. 3D, the nanoscale electrical component network can be used as a portion of an integrated circuit. Input voltages $v_i'$, $v_i''$, and $v_i'''$ may be applied to the nanoscale electrical component lattice at inputs 312 and output voltages $v_o'$, $v_o''$, and $v_o'''$ 314 may be accessed as the result of operation of the nanoscale electrical component network that represents a portion of an integrated circuit. In general, the input and output voltages $v_i'$, $v_i''$, and $v_i'''$ and $v_o'$, $v_o''$, and $v_o'''$ have relatively low magnitudes compared with the WRITE voltages $v_w$. Depending on the types of nanowires, types of dopants employed in the case of semiconductor nanowires, and the types of nanowire-junction molecules employed in the nanowire crossbar, many different, but similar configuring processes may be used to configure nanowire crossbars into nanowire-based electrical components networks. The example of FIG. 3 is meant to illustrate a general process by which nanowire crossbars may be configured as useful portions of electronic circuits.

Figure 4A:
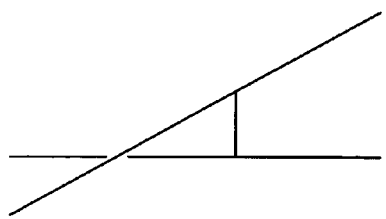
FIGS. 4A-4F schematically illustrate a number of simple electrical components that can be programmed using configurable nanowire junctions within a nanowire crossbar.
Figure 4B:
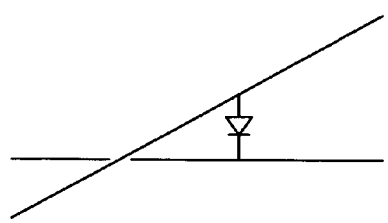
Figure 4C:
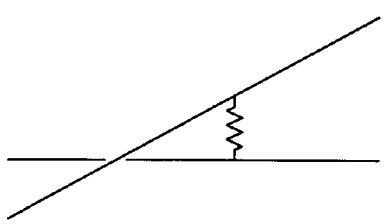
Figure 4D:
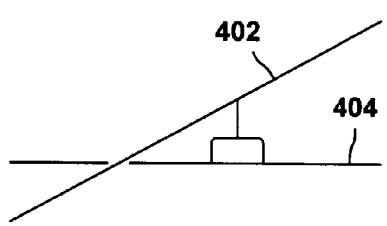
Figure 4E:
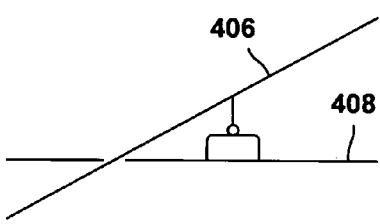
Figure 4F:
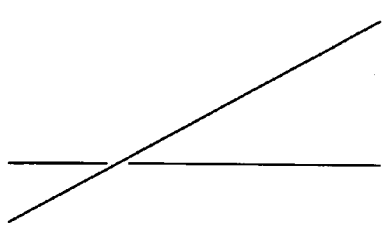

Nanowire junctions in nanowire crossbars may be configured, in various techniques depending on the chemical nature of the nanowires and nanowire-junction-spanning molecules, to form a wide variety of different, simple electronic components. FIG. 4 schematically illustrates a number of simple electrical components that can be programmed using configurable nanowire junctions with a nanowire crossbar. A nanowire junction may operate as (1) a simple conductive connection between two nanowires, as shown in FIG. 4A; (2) a diode that conducts current in only one direction between two nanowires, as shown in FIG. 4B; (3) a resistor, with the magnitude of resistance configurable by application of different configuring voltages, as shown in FIG. 4C; (4) a negatively doped field-effect transistor ("nFET"), as shown in FIG. 4D; (5) a positively doped field-effect transistor ("pFET"), as shown in FIG. 4E; and (6) the overlapping of two conductive nanowires, with the voltage and current associated with each nanowire completely independent from one another, as shown in FIG. 4F.

The nFET and pFET nanowire junctions perform switch operations, controlled by the signal level placed on gate wires, that can either enable or disable source/drain wires.

An enabled source/drain wire allows current to flow beyond the nFET or pFET nanowire junction, while current does not flow beyond the nFET or pFET nanowire junction when the source/drain wire is disabled. However, nFETs and pFETs exhibit opposite behavior based on the signal level applied to the gate wires. In the case of the nFET, shown in FIG. 4D, a relatively low signal on the gate nanowire 402 causes the nFET to disable source/drain nanowire 404, while a relatively high signal on gate nanowire 402 causes the nFET to enable source/drain nanowire 404. By contrast, in the case of the pFET shown in FIG. 4E, a relatively low signal on gate nanowire 406 causes the pFET to enable source/drain nanowire 408, and a relatively high signal on gate nanowire 406 causes the pFET to disable source/drain nanowire 408. Note that a nanowire junction may also be configured as an insulator, essentially interrupting conduction at the nanowire junction with respect to both overlapping nanowires.

Thus, as discussed above with reference to FIGS. 1-4, a two-dimensional nanowire crossbar may be fabricated and then configured as a network of electrical components. Note also that a nanowire junction, although shown in FIGS. 4A-4F to comprise the nanowire junction of two single nanowires, may also comprise a number of nanowire junctions between a number of nanowires in a first layer of a nanowire crossbar that together comprise a single conductive element and the nanowires in a second nanowire layer that together comprise a second conductive element.

Certain types of nanowire junctions have configurable electrical resistances. When certain types of molecules are used for nanowire junctions, the initially relatively high resistances of the nanowire junctions may be lowered by applying relatively large positive voltages to the nanowire junctions. The resistances of the nanowire junctions may be a function of the magnitudes of the highest voltages applied to the nanowire junction. By applying higher and higher positive voltages to a nanowire junction, the resistance of the nanowire junction may be made lower and lower. A relatively low resistivity state achieved by application of a positive voltage may be reversed by applying a sufficiently high, negative voltage. Thus, not only is the electrical resistance of a nanowire junction configurable, the electrical resistance may also be reconfigurable, depending on the type of molecules forming the nanowire junction.

Note that the term "signal" refers to a detectable low or high physical quantity, such as voltage and current, that can be input, output, and transmitted through nanowire crossbars. The terms "low" and "high" generally refer to ranges of values. For example, a signal that ranges between no signal and a signal threshold may be called a "low signal," and any signal above the signal threshold is called a "high signal." A low signal is represented by the bit value "0," and a high signal is represented by the bit value "1."

Overview of Nanowire-Crossbar-Based Logic Arrays, Latch Arrays, and Switch Arrays Various types of arrays can be implemented by nanowire crossbars. Three commonly implemented types of nanowire-crossbar arrays are employed by the present invention: (1) logic arrays; (2) switch arrays; and (3) latch arrays. Note that, in each of the three commonly implemented types of nanowire-crossbar arrays, one of the layers of wires can be of a scale other than nanoscale, such as microscale or sub-microscale.

Nanowire-crossbar logic arrays commonly implement logic functions, transforming input binary signals to output binary signals according to a logic function that can be expressed as a table of input and corresponding output values. Nanowire-crossbar logic arrays include logic-implementing components, formed at nanowire junctions between overlapping nanowires, that perform logic operations on input signals. Nanowire-crossbar logic arrays commonly employ diodes, pull-up resistors, and pull-down resistors to perform logic operations. It is well known in the art of electronics that passing signals across diodes and resistors can degrade signal strength. Cascading diode-resistor logic can degrade signals to undetectable levels after only a few logic operations. Since signal degradation is cumulative with each diode-resistor logic stage, amplification of degraded signals between diode-resistor logic stages is needed to restore signal integrity. Diode-resistor logic generally cannot be used to store and invert logic states. Sequential logic generally relies on intermediate storage and inversion of logic states, and diode-resistor logic cannot therefore be used to easily and efficiently perform sequential logic.

Figure 5A:
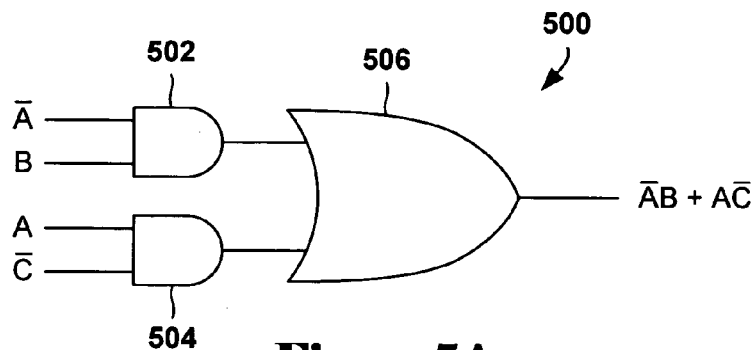
FIG. 5A illustrates an exemplary logic function.

FIG. 5A illustrates an exemplary logic function. Logic function 500 receives signals A, $\overline{A}$, B, and $\overline{C}$, and outputs a signal that is a specific combination of the input signals. In digital systems, AND gates perform a binary "×" operation on input signals and OR gates perform a binary "+" operation on input signals. AND gate 502 receives two input signals, $\overline{A}$ and B, and outputs signal $\overline{A} \times B$, generally referred to as "$\overline{A}B$." Likewise, AND gate 504 receives input signals A and $\overline{C}$ and outputs signal $A\overline{C}$. Next, OR gate 506 receives output signal $\overline{A}B$ from AND gate 502 and output signal $A\overline{C}$ from AND gate 504 and outputs signal $\overline{A}B+A\overline{C}$.

Figure 5B:
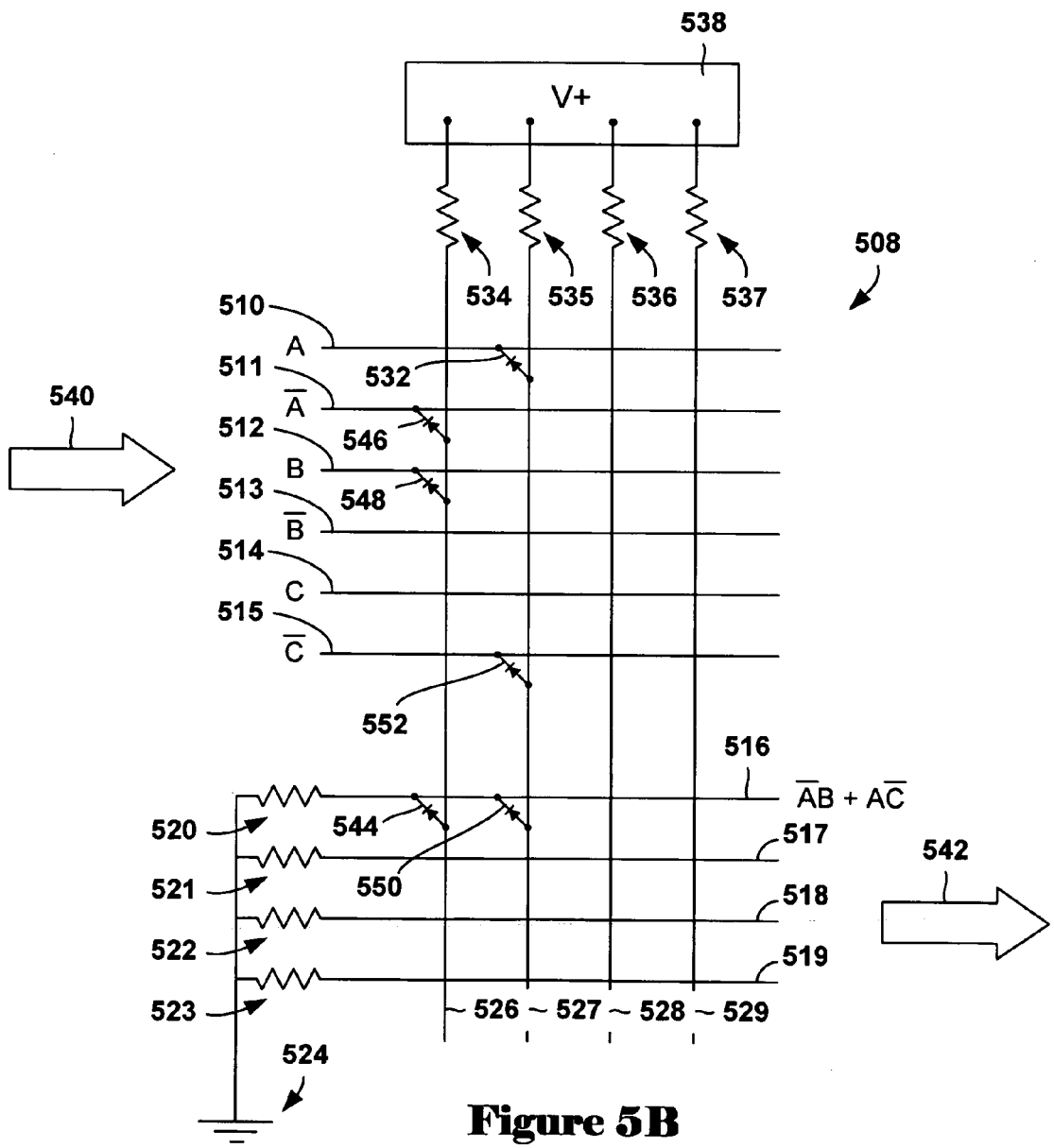
FIG. 5B illustrates an exemplary nanowire-crossbar diode-resistor logic array that implements the logic function shown in FIG. 5A.

FIG. 5B illustrates an exemplary nanowire-crossbar diode-resistor logic array that implements the logic function shown in FIG. 5A. Nanowire-crossbar logic array 508 has six logic-array input lines 510-515, four logic-array output lines 516-519 interconnected through resistors 520-523 to ground 524, and four internal signal lines 526-529 interconnected with logic-array input lines 510-515 and logic-array output lines 516-519 through diodes, such as diode 532. Internal signal lines 526-529 are also interconnected, via resistors 534-537, to driving input-voltage source 538. Selective placement of interconnecting diodes produces the AND/OR logic shown in FIG. 5A. Because it is difficult to implement diode-resistor-based crossbars that invert logic signals, each of the input signals A, B, and C input on logic-array input lines 510, 512, and 514, respectively, is paired with complementary input signals $\overline{A}$, $\overline{B}$ and $\overline{C}$ on logic-array input lines 511, 513, and 515, respectively. Input arrow 540 and output arrow 542 show the general movement of signals into and out of nanowire-crossbar diode-resistor logic array 508, with signals input from the top left and output from the bottom right.

In FIG. 5B, a high-voltage input signal is arbitrarily designated as logic state "1," and a low voltage input signal is arbitrarily designated as logic state "0." Driving input-voltage source 538 places a high voltage on internal signal lines 526-529. When both input signals $\overline{A}$ and B, on logic-array input lines 511 and 512 respectively, are in a high voltage state, then internal signal line 526 maintains a high-voltage state, resulting in interconnection of internal signal line 526 with logic-array output line 516 through forward-biased diode 544, resulting in a high voltage on logic-array output line 516. However, if either or both of input signals $\overline{A}$ and B, on logic-array input lines 511 and 512 respectively, are in a low voltage state, then forward-biased diodes 546 and 548 provide a low-impedance path for current to flow from internal signal line 526 to either or both of logic-array input lines 511 and 512, resulting in a low state on internal signal line 526 and a low voltage on logic-array output line 516. Similarly, when both input signals A and $\overline{C}$, on logic-array input lines 510 and 515 respectively, are in a high voltage state, then internal signal line 527 maintains a high voltage state, resulting in interconnection of internal signal line 527 with logic-array output line 516 through forward-biased diode 550 However, if either or both of input signals A and $\overline{C}$, on logic-array input lines 510 and 515 respectively, are in a low voltage state, then forward-biased diodes 532 and 552 provide a low-impedance path for current to flow from internal signal line 527 to either or both of logic-array input lines 510 and 515, resulting in a low state on internal signal line 527 and a low voltage on logic-array output line 516.

As another way to interpret nanowire-crossbar diode-resistor logic arrays, such as nanowire-crossbar diode-resistor logic array 508, AND operations are performed on signals on logic-array input lines interconnecting with internal signal lines, and OR operations are performed on signals on internal signal lines interconnecting with logic-array output lines. For example, signals $\overline{A}$ and B, on logic-array input lines 511 and 512 respectively, pass onto interconnecting internal signal line 526 to form signal $\overline{A}B$, and signals A and $\overline{C}$ on logic-array input lines 510 and 515 respectively, pass onto interconnecting internal signal line 527 to form signal $A\overline{C}$. Signals $\overline{A}B$ and $A\overline{C}$, on internal signal lines 526 and 527, pass onto interconnecting logic-array output line 516 to form signal $\overline{A}B+A\overline{C}$.

Figure 6A:
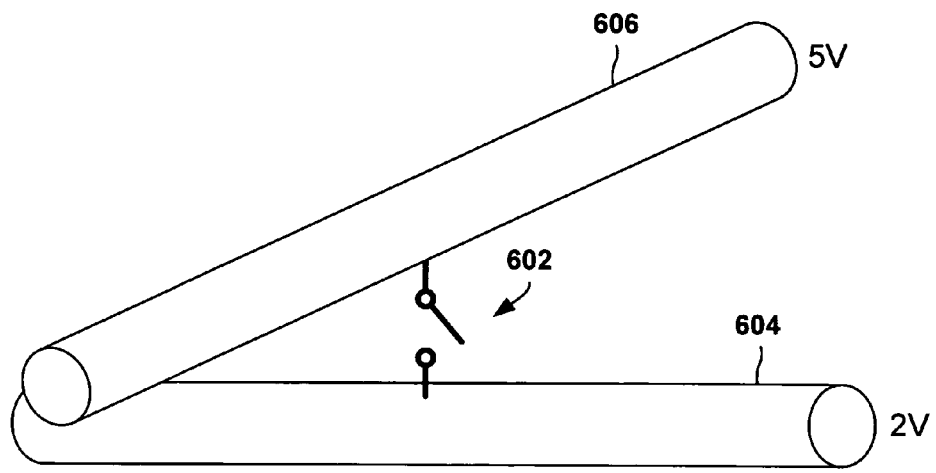
FIGS. 6A-6B illustrate conceptual operation of a nanowire-junction switch constructed at a nanowire junction between two overlapping nanowires.
Figure 6B:
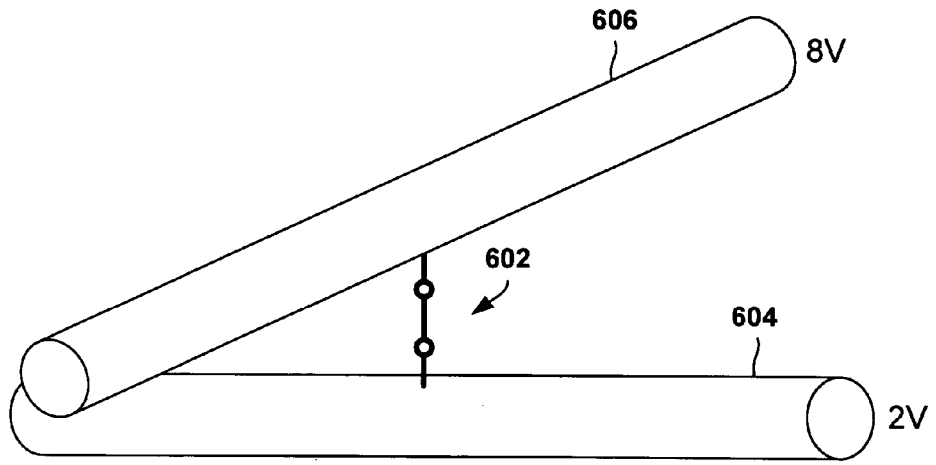

A nanowire-junction switch controls the transmission of signals between two overlapping nanowires interconnected by the nanowire-junction switch. Signal transmission across a nanowire-junction switch is controlled by the potential difference, or voltage drop, between the two switch-interconnected nanowires. FIGS. 6A-6B illustrate conceptual operation of a nanowire-junction switch constructed at a nanowire junction between two overlapping nanowires. The switch shown in FIGS. 6A-6B is represented as a mechanical switch that opens and closes, for clarity of illustration, but the switch may actually be implemented as a number of molecules that can be placed into different resistive states or other physical states. Signals are readily transmitted across closed switches and are not transmitted across open switches.

FIG. 6A shows switch 602, in an open position, at the intersection between nanowires 604 and 606. When a voltage drop across switch 602 is equal to or exceeds a close-voltage-threshold value for a sufficient amount of time, switch 602 transitions to a closed position. For example, assume that switch 602 has a close-voltage threshold of 5V. In FIG. 6A, a voltage of 2V is applied to nanowire 604 and a voltage of 5V is applied to nanowire 606. The voltage drop across switch 602 is 3V. The voltage drop across switch 602 is less than 5V, and switch 602 therefore remains in an open position. Switch 602 also remains open if the voltage drop is 0 volts or a negative-voltage value. However, in FIG. 6B, if a voltage of 8V is applied to nanowire 606, then the voltage drop across switch 602 is greater than 5V, and switch 602 therefore transitions to a closed position. Similarly, switches may have open-voltage thresholds that control when switches transition from a closed position to an open position.

Figure 7:
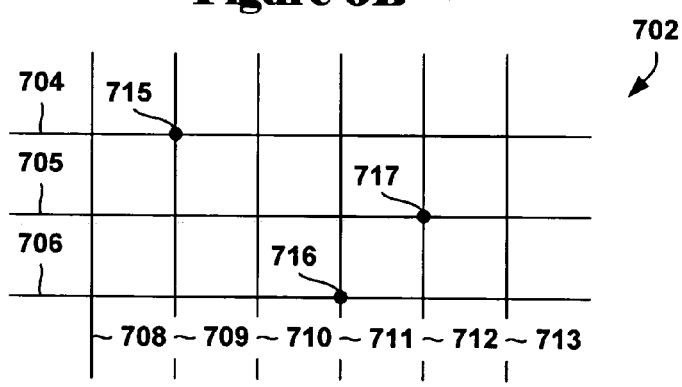
FIG. 7 illustrates an exemplary nanowire-crossbar switch array.

FIG. 7 illustrates an exemplary nanowire-crossbar switch array. Nanowire-crossbar switch array 702 includes two overlapping layers of nanowires. A first layer of nanowires is represented by three horizontal nanowires 704-706. A second layer of nanowires is represented by six vertical nanowires 708-713. A layer of molecules forms three switches 715-717, shown as filled circles at three intersections between a nanowire in one layer and an overlapping nanowire in the other layer. Switches 715-717 operate by application of voltages to horizontal nanowires 704-706 and/or application of voltages to vertical nanowires 708-713 to create voltage drops across switches 715-717 to set switches 715-717 into open and closed states in order to route signals to desired locations within a nanowire crossbar.

Nanowire-crossbar latch arrays store input signals and, at a later time, output either the restored input signal or an inverted input signal. Nanowire-crossbar latch arrays include a series of signal lines in a first layer of nanowires that each interconnects with an enable line and two control lines in a second layer of nanowires. Each individual signal line, interconnecting with the enable line and the two control lines, creates a single nanowire-crossbar latch. Before discussing nanowire-crossbar latch arrays, it is helpful to discuss the operation of an individual nanowire-crossbar latch.

Figure 8:
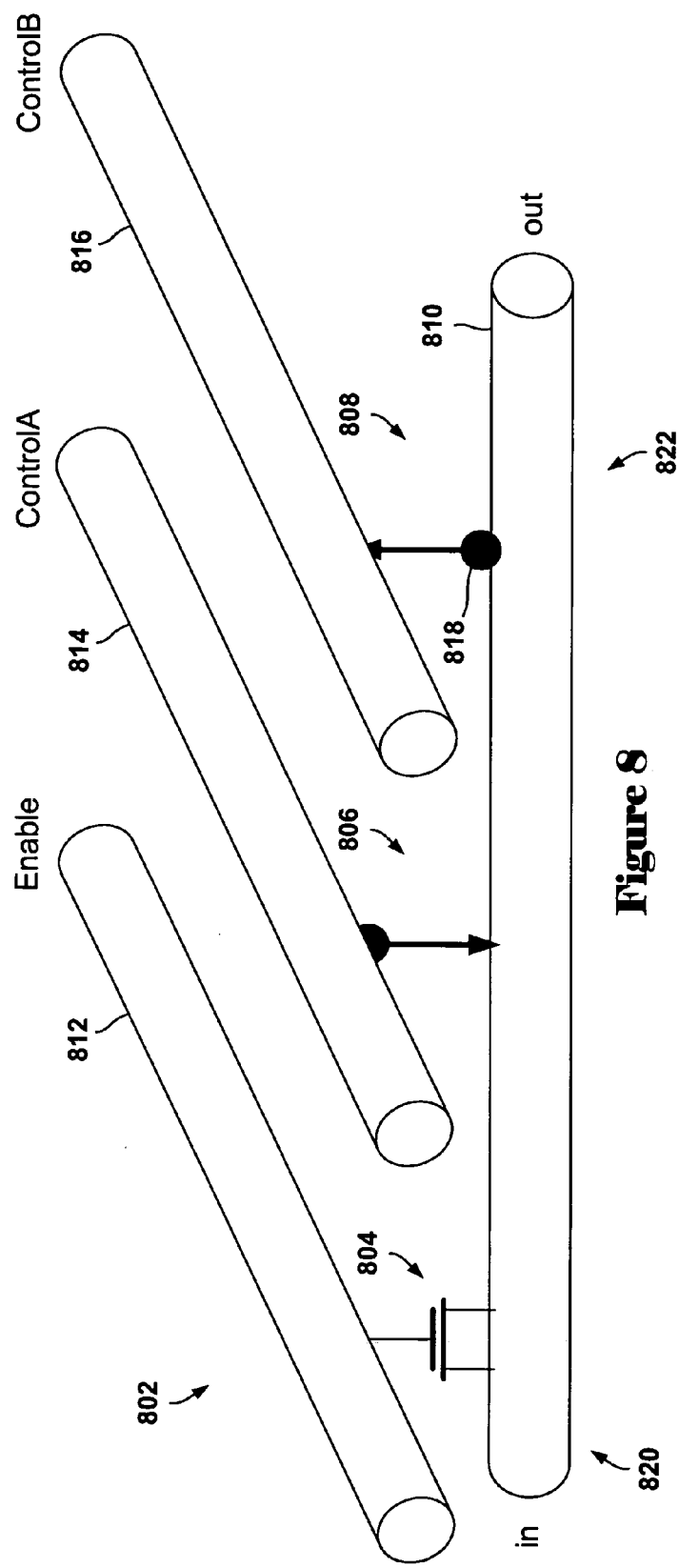
FIG. 8 illustrates an exemplary nanowire-crossbar latch.

FIG. 8 illustrates an exemplary nanowire-crossbar latch. Nanowire-crossbar latch 802 includes field-effect transistor ("FET") 804 and two asymmetric switches 806 and 808, implemented as three nanowire junctions connecting signal line 810 to enable line 812, control line ControlA 814 and control line ControlB 816, respectively. Note that the polarity of asymmetric switch 806 is opposite from the polarity of asymmetric switch 808, as shown by oppositely-facing arrows. Note also that enable line 812 operates as a gate nanowire and signal line 810 operates as a source/drain nanowire. Input signals are transmitted into a nanowire-crossbar latch via the signal line, under the control of the enable line. Input signals can be placed into temporary storage by applying a series of specific voltage pulses to the control lines to set the asymmetric switches into certain states. Specific voltages are then applied to the control lines, one of which is blocked by an open asymmetric switch, and the other of which is output to the signal line as a restored input signal or restored, inverted input signal.

Asymmetric switches 806 and 808 are represented by arrows extending from circles between signal line 810 and ControlA 814, and between signal line 810 and ControlB 816, indicating a particular polarity for each asymmetric switch. A voltage can be applied across asymmetric switches 806 and 808 by application of different voltages to signal line 810 and/or ControlA 814 and ControlB 816. Voltages can be positive or negative, depending on which of the two nanowires is considered to be at a reference voltage. In FIG. 8, the nanowire on which the circle rests is considered to be the reference nanowire.

Asymmetric switches 806 and 808 open and close at certain voltage-drop thresholds. Application of selected voltages across each nanowire connected by an asymmetric switch can create a voltage drop that equals or exceeds a threshold-voltage value. When a voltage drop equals or exceeds a threshold-voltage-drop value, an asymmetric switch can transition from a closed position to an open position or from an open position to a closed position. There may be two discrete voltage-drop thresholds for controlling switch position: (1) a positive-voltage-drop threshold that controls when an asymmetric switch opens; and (2) a negative-voltage-drop threshold that controls when an asymmetric switch closes.

Enable line 812 operates as a gate, while signal line 810 operates as both a source 820 at the input-signal end of signal line 810, labeled "in," and a drain 822 at the output-signal end of signal line 810, labeled "out," with FET 804 interconnecting enable line 812 to signal line 810. Application of specific voltages to enable line 812 controls signal transmission across signal line 810. When voltage $V_{enable}$ is applied to enable line 812, there is a low-impedance path between source 820 and drain 822, with the source and drain therefore electronically interconnected. When voltage $V_{disable}$ is applied to enable line 812, there is a high-impedance path between source 820 and drain 822, disconnecting the source from the drain.

The nanowire-crossbar latch has two operating states: (1) a programming state, and (2) an output state. The current operating state of the nanowire-crossbar latch is determined by the voltage applied to the enable line. A voltage $V_{enable}$ is applied to the enable line to place the nanowire-crossbar latch into a programming state. In the programming state, the FET enables signal transmission in the signal line from source to drain. Alternately, a voltage $V_{disable}$ is applied to the enable line to place the nanowire-crossbar latch into an output state. In the output state, the FET disables signal transmission in the signal line from source to drain.

The nanowire-crossbar latch is operated by applying a sequence of voltage pulses to the control lines while the nanowire-crossbar latch is in the programming state. The programming-state-voltage-pulse sequence operates to store a signal into the nanowire-crossbar latch by specifically positioning the asymmetric switches. The signal, either a logical "0" or a logical "1," is input on the signal line and the voltage-pulse sequence sets the asymmetric switch positions based on the input signal.

Upon completion of the programming state, the nanowire-crossbar latch can be placed into an output state. During the output state, the input signal in the signal line is disabled by the enable line. One of two sets of voltages is applied to the control lines. The specifically-positioned asymmetric switches operate to allow one of each set of control-line voltages to pass through one of the asymmetric switches to become the new signal-line output. The other of the set of control-line voltages is blocked by an asymmetric switch in an open position. One set of the applied control-line voltages causes the signal line to output a restored signal input, and the other set of applied control-line voltages causes the signal line to output a restored, inverted input signal to the signal.

Figure 9:
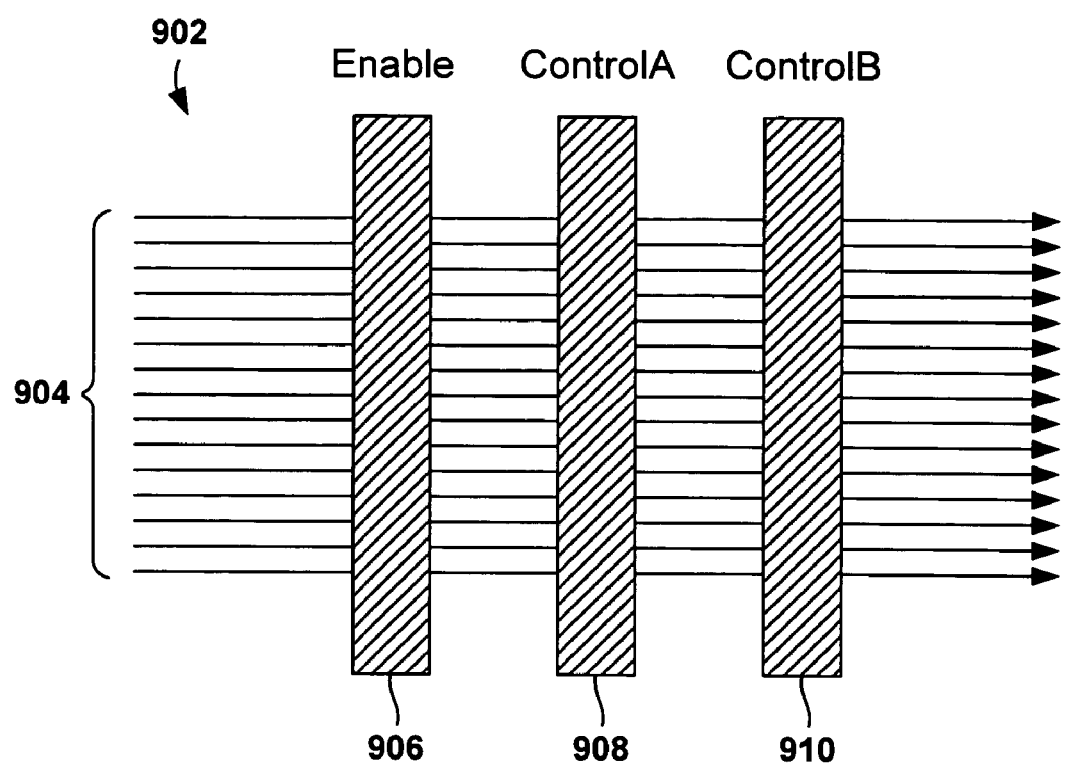
FIG. 9 illustrates an exemplary nanowire-crossbar latch array.

Nanowire-crossbar latch arrays can be implemented by intersecting more than one signal line with the enable line and two control lines of the nanowire-crossbar latch, described above with reference to FIG. 8. FIG. 9 illustrates an exemplary nanowire-crossbar latch array. Nanowire-crossbar latch array 902 includes a number of signal lines 904, with nanowire junctions between each signal line and enable line 906, control line ControlA 908, and control line ControlB 910. For simplicity of illustration, the vertical lines are shown as vertical cross-hatched rectangles. This illustration convention is used in subsequent figures. Each nanowire-crossbar latch within nanowire-crossbar latch array 902 is oriented to operate from left to right, as shown by directional arrows on signal lines 904. Nanowire-crossbar latch arrays allow many degraded input signals, all of which are interconnected by the same enable line and two control lines, to be placed into memory and output as restored-strength signals or inverted restored-strength signals.

Figure 10A:
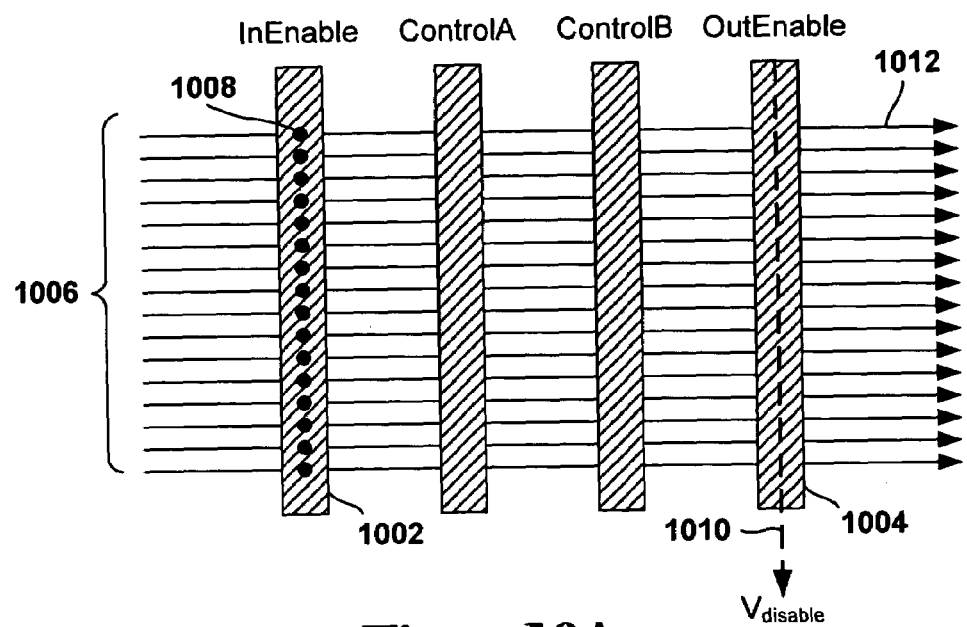
FIGS. 10A-10B illustrate two versions of an exemplary nanowire-crossbar latch array that employs two enable lines.
Figure 10B:
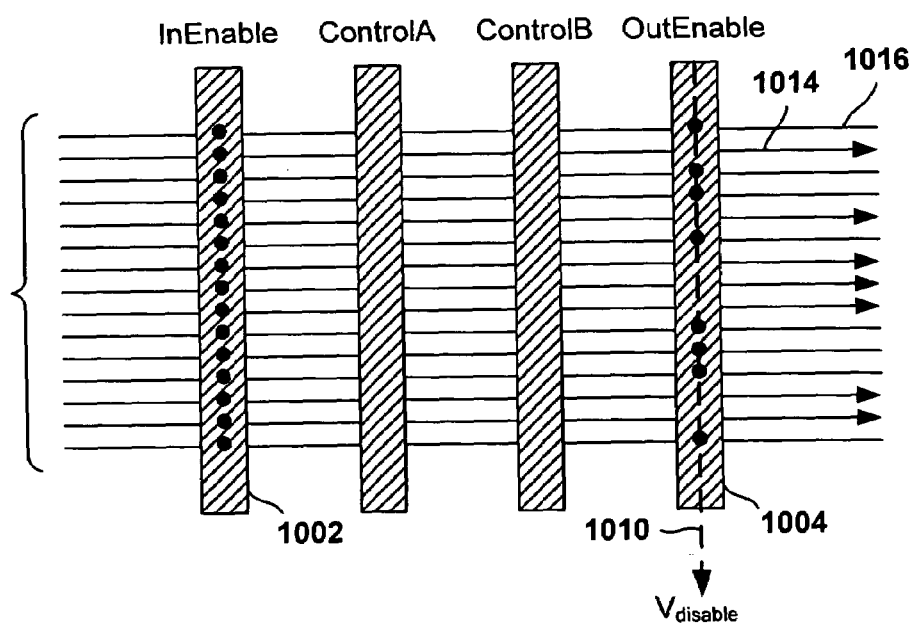

In an alternate nanowire-crossbar latch array embodiment, two enable lines are included in a nanowire-crossbar latch array, which allows one or more nanowire-crossbar-latch outputs to be disabled. FIG. 10A-10B illustrate two versions of an exemplary nanowire-crossbar latch array that employs two enable lines. The two enable lines, enable line 1002, labeled "InEnable" in FIG. 10A-10B, and enable line 1004, labeled "OutEnable" in FIG. 10A-10B, each form a nanowire junction at each signal-line/enable-line intersection. Each nanowire junction at a signal-line/enable-line intersection can be configured, by applying suitable voltages to each enable line and each signal line connected by the configurable nanowire junction, to be: (1) an FET, which produces either a low-impedance path or a high-impedance path across the signal line; or (2) a high resistance nanowire junction. Each filled circle, such as filled circle 1008, indicate that a nanowire junction at a given signal-line/enable-line intersection is an FET. Each unmarked nanowire junction at a given signal-line/enable-line intersection is a high resistance nanowire junction. Voltage $V_{disable}$ 1010, represented by a dashed line, is applied to enable line 1004.

In FIG. 10A, each nanowire junction interconnecting with enable line 1002 is an FET, and each nanowire junction interconnecting with enable line 1004 is a high resistance nanowire junction. Directional arrows on the signal lines, such as directional arrow 1012, indicate signal transmission in each signal line. The constant $V_{disable}$ voltage 1010 applied to enable line 1004 does not affect signal transmission in any of the number of signal lines 1006 shown in FIG. 10A.

In FIG. 10B, each nanowire junction connected to enable line 1002 is an FET, while a portion of the e nanowire junctions connected to enable line 1004 are FETs and a portion of the nanowire junctions connected to enable line 1004 are high resistance nanowire junctions. Application of voltage $V_{disable}$ 1010 to enable line 1004 disables signal transmission in signal lines connected to enable line 1004 by FETs, and does not disable signal transmission in signal lines connected to enable line 1004 by high resistance nanowire junctions. Directional arrows at the end of the signal lines, such as directional arrow 1014, indicate signal transmission in signal lines connected to enable line 1004 by a high resistance nanowire junction, and signal lines lacking a directional arrow, such as signal line 1016, indicate a disabled signal in a signal line connected to enable line 1004 by a FET, caused by application of voltage $V_{disable}$ 1010 to enable line 1004.

Overview of Pipelines and State Machines

Pipelines perform a series of concurrent, stage-by-stage computations, under the control of a single clock cycle, that collectively perform a larger computation. Pipelines are implemented by a number of latches interconnected to one another by logic devices. In pipelines, signals output from a first latch are input to a first logic device, and signals output from the first logic device are input to a second latch. Signals input to a given latch do not depend on signals output from the latch. In other words, there are no feedback loops within a pipeline. Note that, in some cases successive latches may not have logic devices between them. For example, signals output from a first latch are input to a second latch, and the signals output from the second latch are input to a first logic device.

Figure 11A:
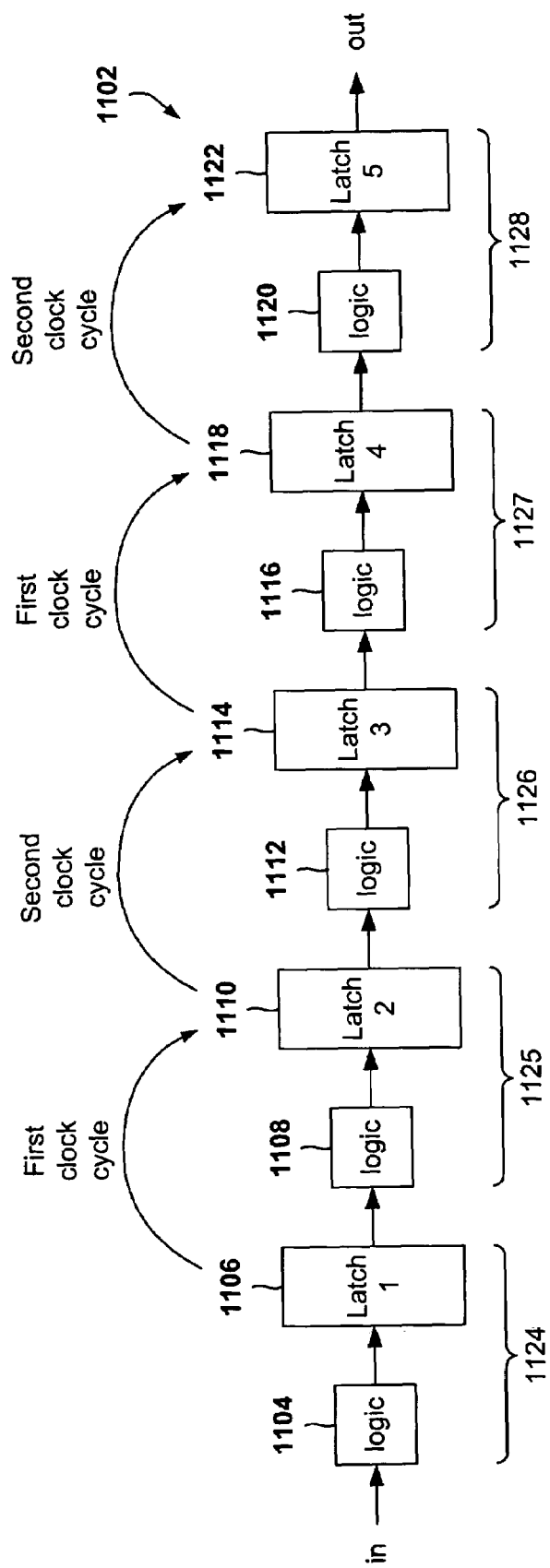
FIG. 11A illustrates an exemplary five-stage pipeline comprising latches and intervening logic devices.

FIG. 11A illustrates an exemplary five-stage pipeline comprising latches and intervening logic devices. Pipeline 1102 includes five logic devices 1104, 1108, 1112, 1116, and 1120 and five latches 1106, 1110, 1114, 1118, and 1122. The latches in FIG. 11A are shown in series, with a logic device between each latch. Lines with arrowheads represent the direction of signal transmission within pipeline 1102. During each clock cycle, signals output from latches 1106, 1110, 1114, and 1118 pass through a logic device and into the next latch in the series. The pipeline shown in FIG. 11A includes five sets of pipeline computational stages 1124-1128, each pipeline computational stage including a logic device and a latch. Pipelines can include a variable number of pipeline computational stages, ranging from one, to hundreds, or even thousands of pipeline computational stages. One stage of a multiple-stage complex computation can be performed by each pipeline computational stage in series, and then passed to the next computational stage in series for a next component computation.

Pipeline 1102 can be clocked so that signals are output from odd-numbered latches 1106 and 1114 and input into even-numbered latches 1110 and 1118 during a first clock cycle. Signals can then be output from even-numbered latches 1110 and 1118 and input into odd-numbered latches 1114 and 1122 during a second clock cycle. For example, in a first clock cycle, a signal output by latch 1106 passes through logic device 1108, and is stored in latch 1110. During a second clock cycle, the signal is output by latch 1110, passes through logic device 1112, and is stored in latch 1114.

Use of pipeline computational stages is advantageous because many large computations can be simultaneously performed, with each computation at a different stage of completion, or at a different pipeline computational stage. The timing of the logic operations are under the control of latches, which, in turn, are under the control of a single clock. Simultaneous performance of large computations can result in a significant decrease in per-computation time. Further, computations can be performed by pipelines that may be too complex to be performed in a single, large step. In addition to controlling the timing of signal transmission, latches also restore signal strength and optionally invert stored signals. Signal-strength restoration and inversion are generally needed when diode-resistor logic is employed within a logic device in a pipeline. Incorporation of latches into pipeline computational stages may have additional advantages, such as improved density and lower power consumption.

FIGS. 11B-11C illustrate signal transmission during two consecutive hypothetical clock cycles in the exemplary pipeline shown in FIG. 11A. In FIG. 11B, during a first clock cycle, latches 1106 and 1114 are in an output state and latches 1110 and 1118 are in a programming state. At the start of the first clock cycle, signal "A" 1124 is stored in latch 1106 and signal "B" 1126 is stored in latch 1114. During the first clock cycle, signal "A" is output by latch 1106, passes through logic device 1108, and is input to latch 1110 for storage. Similarly, during the first clock cycle, signal "B" is output by latch 1114, passes through logic device 1116, and is input to latch 1118 for storage. In FIG. 11C, during a second clock cycle, latches 1110 and 1118 are in an output state and latches 1114 and 1122 are in a programming state. At the start of the second clock cycle, signal "A" 1124 is stored in latch 1110 and signal "B" 1126 is stored in latch 1118. During the second clock cycle, signal "A" is output by latch 1110, passes through logic device 1112, and is input to latch 1114 for storage. Similarly, during the second clock cycle, signal "B" is output by latch 1118, passes through logic device 1120, and is input to latch 1122 for storage.

State machines perform a series of stage-by-stage computations, under the control of a single clock cycle, that collectively perform a larger computation. State machines are implemented by a number of latches interconnected to one another by logic devices. In state machines, signals output from a first latch can be input to a second latch, or to some other latch within the state machine, or even back to the first latch. In other words, there can be feedback loops within a state machine.

Figure 12:
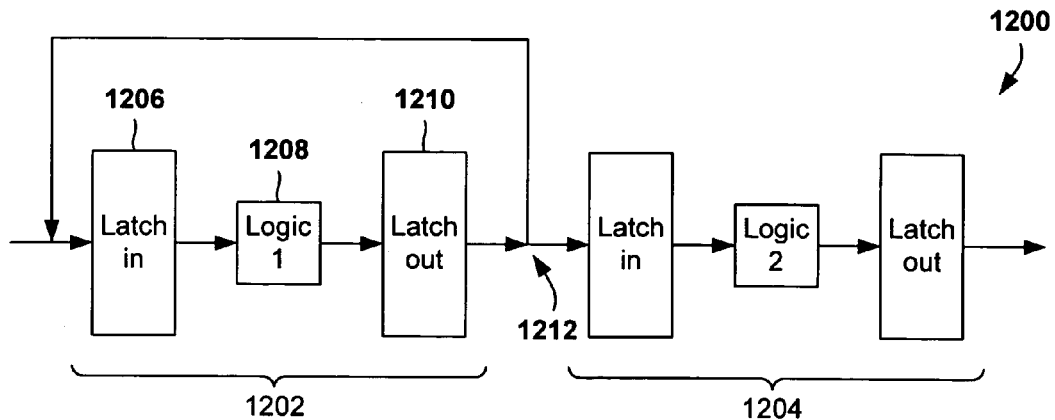
FIG. 12 illustrates an exemplary state machine.

FIG. 12 illustrates an exemplary state machine. State machine 1200 comprises two synchronous state machine computational stages 1202 and 1204. Each state machine computational stage is composed of an input latch, a logic device, and an output latch. For example, state machine computational stage 1202 comprises input latch 1206, logic device 1208, and output latch 1210. Arrows in FIG. 12 represent the direction of signal transmission within state machine 1200. A signal input to state machine computational stage 1202 is stored into input latch 1206 during a first clock cycle. During a second clock cycle, the signal is passed through logic device 1208 and stored into output latch 1210. During a third clock cycle, the signal is output from output latch 1210 and encounters branch-point 1212. From branch-point 1218, the signal can be routed into state machine computational stage 1204, the signal can be routed back into computational stage 1202, or the signal can be routed to another state machine computational stage (not shown) within state machine 1200. During a fourth clock cycle, depending on which path the signal took in the previous clock cycle, the signal-passing process is repeated in either state machine computational stage 1202, state machine computational stage 1204, or in another state machine computational stage (not shown) within state machine 1200. Note that the number of state machine computational stages employed to perform a computation can be varied. Typically, the more state machine computational stages employed, the faster that multiple computations can be performed, because more computations can be performed simultaneously, and more routing options are available.

Implementation of Synchronous Nanowire-Crossbar Pipelines and State Machines

Various embodiments of the present invention are directed to implementing synchronous nanowire-crossbar pipelines and state machines from combinations of multiple computational stages. Each computational stage comprises nanowire-crossbar-based logic arrays and latch arrays, interconnected with other computational stages by switch arrays to create larger structures for performing complex computations that can be broken up into discrete logic stages. Each logic stage is performed within a computational stage and then synchronously passed to another computational stage.

Figure 13:
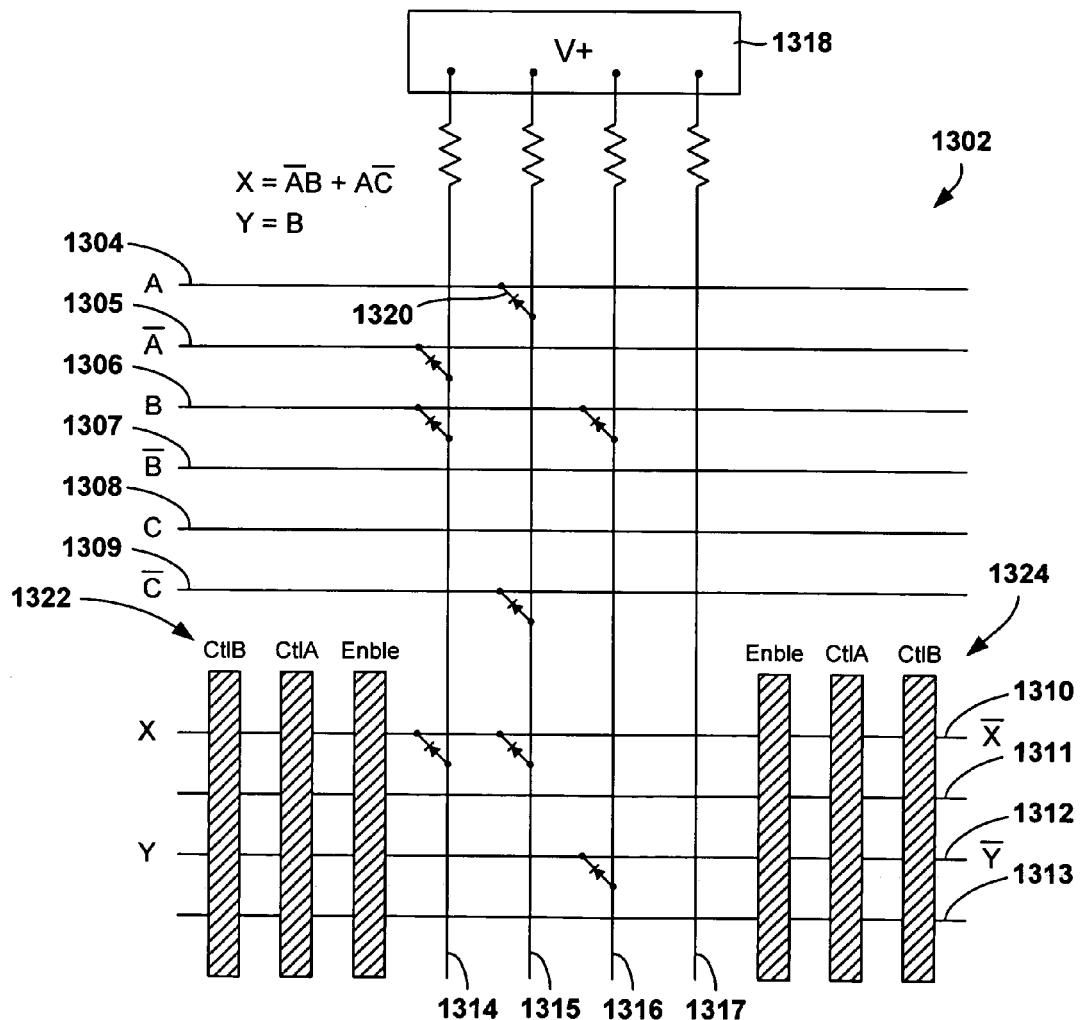
FIG. 13 illustrates an exemplary synchronous nanowire-crossbar pipeline computational stage that represents one embodiment of the present invention.

FIG. 13 illustrates an exemplary synchronous nanowire-crossbar pipeline computational stage that represents one embodiment of the present invention. Synchronous nanowire-crossbar pipeline computational stage 1302 includes six logic-array input lines 1304-1309, four logic-array output lines 1310-1313, and four internal signal lines 1314-1317 interconnected with logic-array input lines 1304-1309 and logic-array output lines 1310-1313 through diodes, such as diode 1320. Internal signal lines 1314-1317 are also connected, via pull-up resistors, to driving input-voltage source 1318. Logic-array output lines 1310-1313 function as signal lines for two nanowire-crossbar latch arrays, non-inverting nanowire-crossbar latch array 1322, and inverting nanowire-crossbar latch array 1324. Note that, although not shown, logic-array output lines 1310-1313 interconnect, via pull-down resistors, to ground.

Selective placement of interconnecting diodes between the internal signal lines and the logic-array input lines, and between the internal signal lines and the logic-array output lines, produces the desired logic. In the exemplary synchronous nanowire-crossbar pipeline computational stage shown in FIG. 12, logic-array output line 1310 receives signals $\overline{AB}$ and $\overline{AC}$ and outputs signal X, which is equal to $\overline{AB}+\overline{AC}$. Logic-array output line 1312 receives signal B, and outputs signal Y, which is equal to signal B. Logic-array output lines 1310 and 1312 transmit signals X and Y, respectively, to the left and to the right. When output signals X and Y transmit to the left, output signals X and Y are stored in non-inverting nanowire-crossbar latch array 1322, and restored-strength signals X and Y are output from synchronous nanowire-crossbar pipeline computational stage 1302 during the next clock cycle. When output signals X and Y transmit to the right, output signals X and Y are stored in inverting nanowire-crossbar latch array 1324, and restored-strength, inverted versions of X and Y, or $\overline{X}$ and $\overline{Y}$, are output from synchronous nanowire-crossbar pipeline computational stage 1302 during the next clock cycle.

Figure 14:
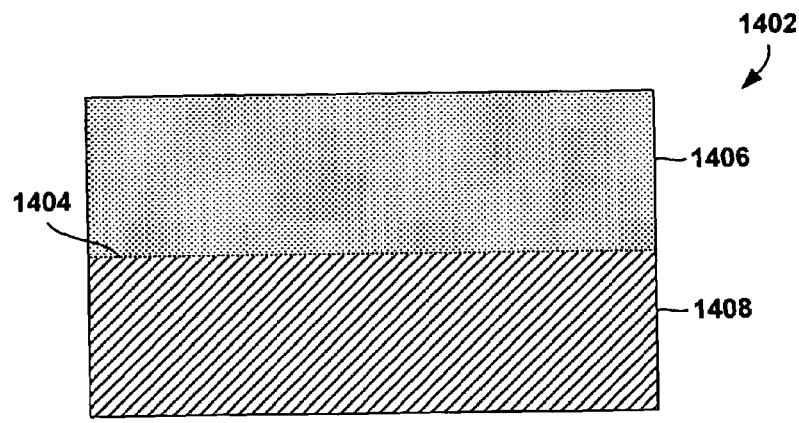
FIG. 14 is a symbolic representation of the exemplary synchronous nanowire-crossbar pipeline computational stage of FIG. 13 that represents one embodiment of the present invention.

FIG. 14 is a symbolic representation of the exemplary synchronous nanowire-crossbar pipeline computational stage of FIG. 13 that represents one embodiment of the present invention. Subsequent figures utilize the same symbolic representation. In FIG. 14, synchronous nanowire-crossbar pipeline computational stage 1402 is represented by a rectangle, divided lengthwise by horizontal dashed line 1404. Input signal region 1406 is represented by a dotted rectangle at the top portion of synchronous nanowire-crossbar pipeline computational stage 1402, above horizontal dashed line 1404. Output signal region 1408 is represented by a cross-hatched rectangle at the bottom portion of synchronous nanowire-crossbar pipeline computational stage 1402, below horizontal dashed line 1404. Although not shown by the symbolic representation of a synchronous nanowire-crossbar pipeline computational stage, nanowire-crossbar latch arrays are included in output signal region 1408.

Figure 15B:
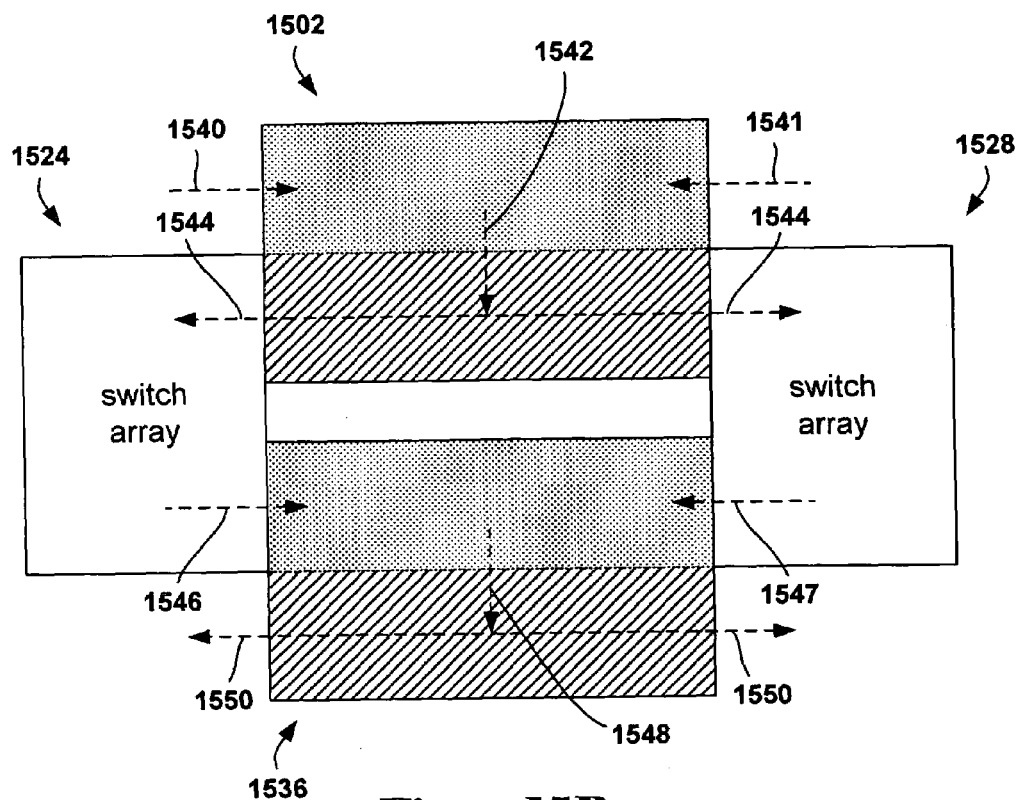
FIG. 15B shows a symbolic representation of the exemplary two-stage synchronous nanowire-crossbar pipeline shown in FIG. 15A that represents one embodiment of the present invention.
Figure 15A:
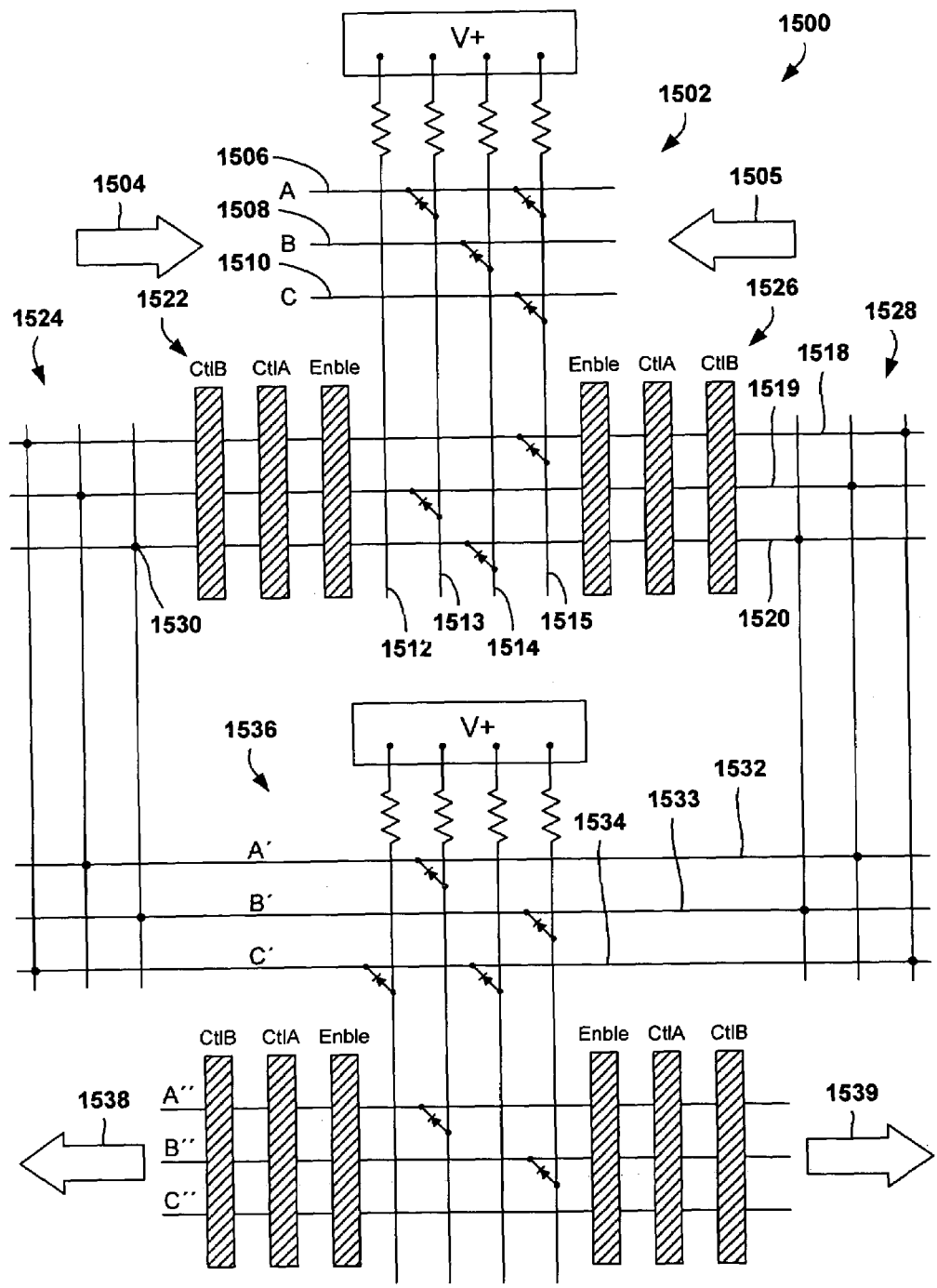
FIG. 15A shows a schematic representation of an exemplary two-stage synchronous nanowire-crossbar pipeline that represents one embodiment of the present invention.

FIGS. 15A-15B illustrate two synchronous nanowire-crossbar pipeline computational stages, interconnected by two nanowire-crossbar switch arrays, to form an exemplary two-stage synchronous nanowire-crossbar pipeline that represents one embodiment of the present invention. FIG. 15A shows a schematic representation of an exemplary two-stage synchronous nanowire-crossbar pipeline that represents one embodiment of the present invention. First synchronous nanowire-crossbar pipeline computational stage 1502 receives input signals from the left and from the right, as shown by input arrows 1504 and 1505, pointing to logic-array input lines 1506, 1508, and 1510. Input signals transmit, via diodes, to internal signal lines 1512-1515, and from internal signal lines 1512-1515, via diodes, to logic-array output lines 1518-1520. Signals in logic-array output lines 1518-1520 can transmit in two directions. When signals transmit to the left, signals in logic-array output lines 1518-1520 transmit into non-inverting nanowire-crossbar latch array 1522 and nanowire-crossbar switch array 1524. When signals transmit to the right, signals in logic-array output lines 1518-1520 transmit into inverting nanowire-crossbar latch array 1526 and nanowire-crossbar switch array 1528. Switches in nanowire-crossbar switch arrays, such as switch 1530, interconnect logic-array output lines 1518-1520 from first synchronous nanowire-crossbar pipeline computational stage 1502 to logic-array input lines 1532-1534 of second synchronous nanowire-crossbar pipeline computational stage 1536.

Signals input to second synchronous nanowire-crossbar pipeline computational stage 1536 transmit in a similar manner as through first synchronous nanowire-crossbar pipeline computational stage 1502, transmitting through diodes to internal signal lines, and through diodes from internal signal lines to logic-array output lines. Output arrows 1538 and 1539 represent signals output from second synchronous nanowire-crossbar pipeline computational stage 1536 to the left, as shown by output arrow 1538, or the right, as shown by output arrow 1539. In FIG. 15A, signals A, B, and C are input to first synchronous nanowire-crossbar pipeline computational stage 1502. Signals A', B', and C', which are input to second synchronous nanowire-crossbar pipeline computational stage 1536, are the original signals A, B, and C transformed by the nanowire-crossbar logic array in first synchronous nanowire-crossbar pipeline computational stage 1502. Similarly, signals A", B", and C" are the original signals A', B', and C' transformed by the nanowire-crossbar logic array in second synchronous nanowire-crossbar pipeline computational stage 1536.

Note that each inverting/non-inverting pair of nanowire-crossbar latch arrays in a given synchronous nanowire-crossbar pipeline computational stage is out of phase by 180° from the inverting/non-inverting pair of nanowire-crossbar latch arrays in the synchronous nanowire-crossbar pipeline computational stages immediately before and immediately after the given synchronous nanowire-crossbar pipeline computational stage. During operation, when one inverting/non-inverting pair of nanowire-crossbar latch array outputs signals, the next pair of nanowire-crossbar latch arrays in the synchronous nanowire-crossbar pipeline inputs signals, and when one pair of inverting/non-inverting nanowire-crossbar latch arrays inputs signals, the next pair of inverting/non-inverting nanowire-crossbar latch arrays in the synchronous nanowire-crossbar pipeline outputs signals.

FIG. 15B shows a symbolic representation of the exemplary two-stage synchronous nanowire-crossbar pipeline shown in FIG. 15A that represents one embodiment of the present invention. Two synchronous nanowire-crossbar pipeline computational stages 1502 and 1536 are interconnected by nanowire-crossbar switch arrays 1524 and 1528, represented by unfilled rectangles. Dashed lines with arrowheads represent the direction of signal transmission within the two-stage synchronous nanowire-crossbar pipeline. Dashed lines 1540 and 1541 represent signals input into first synchronous nanowire-crossbar pipeline computational stage 1502. Note that dashed lines 1540 and 1541 represent signals input to the two-stage synchronous nanowire-crossbar pipeline from some device external to the two-stage synchronous nanowire-crossbar pipeline. Dashed arrow 1542 represents signals in internal signal lines in first synchronous nanowire-crossbar pipeline computational stage 1502. Two-headed dashed arrow 1544 represents signals transmitting in logic-array output lines in first synchronous nanowire-crossbar pipeline computational stage 1502. Two-headed dashed arrow 1544 represents signals transmitting out of first synchronous nanowire-crossbar pipeline computational stage 1502 and into nanowire-crossbar latch arrays 1524 and 1528. Dashed arrows 1546 and 1547 represent signals transmitting out of nanowire-crossbar latch arrays 1524 and 1528 and into second synchronous nanowire-crossbar pipeline computational stage 1536. Dashed arrow 1548 represents the transmission of signals in internal signal lines in second synchronous nanowire-crossbar pipeline computational stage 1536. Two-headed dashed arrow 1550 represents signals transmitting out of second synchronous nanowire-crossbar pipeline computational stage 1536 to the left and to the right. Note that two-headed dashed arrow 1550 represents signals output from the two-stage synchronous nanowire-crossbar pipeline to an external device.

Figure 16:
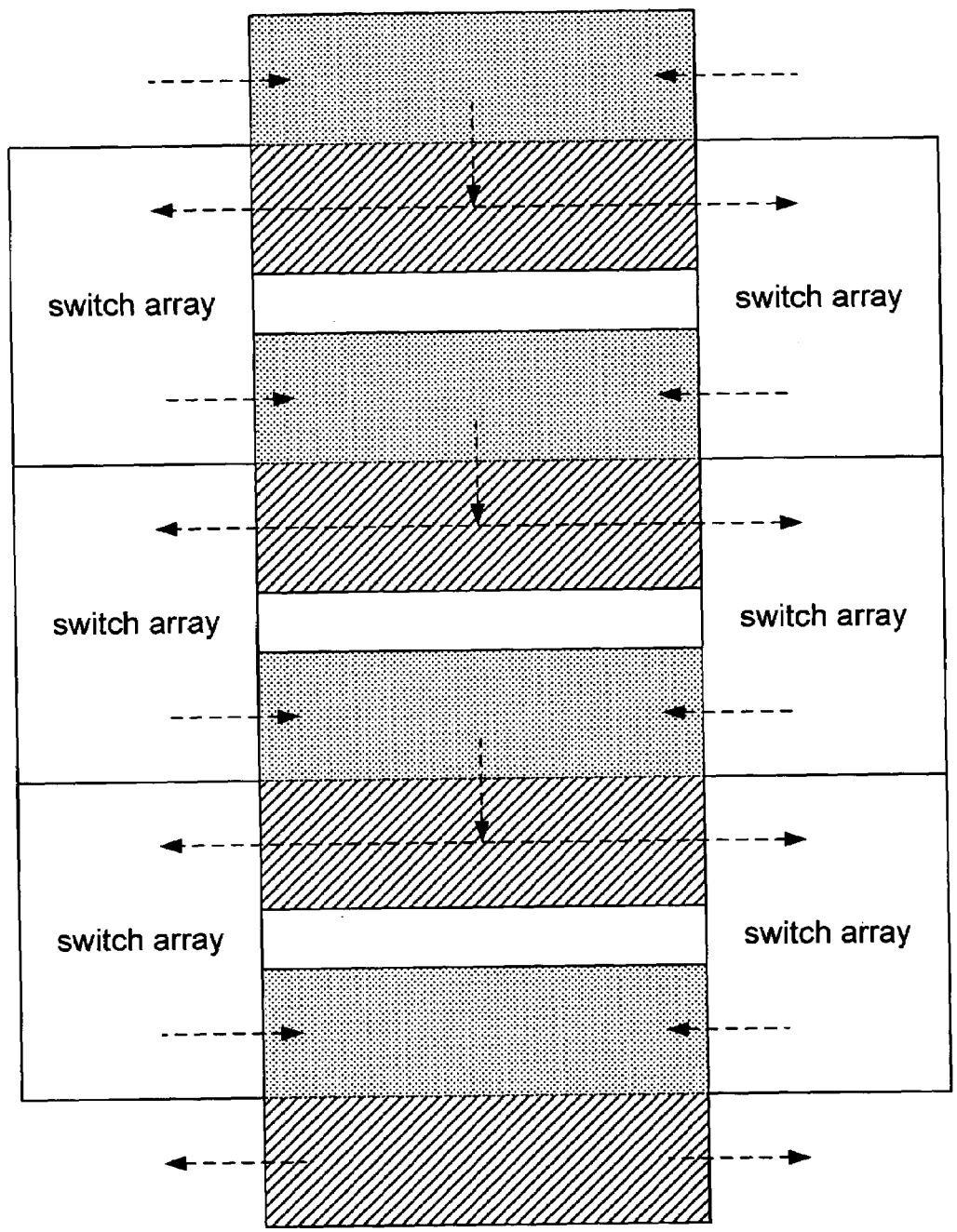
FIG. 16 illustrates four synchronous nanowire-crossbar pipeline computational stages interconnected by six nanowire-crossbar switch arrays to form an exemplary three-stage synchronous nanowire-crossbar pipeline that represents one embodiment of the present invention.

FIG. 16 illustrates four synchronous nanowire-crossbar pipeline computational stages interconnected by six nanowire-crossbar switch arrays to form an exemplary three-stage synchronous nanowire-crossbar pipeline that represents one embodiment of the present invention. As shown by FIG. 16, additional synchronous nanowire-crossbar pipeline computational stages can be interconnected to form larger-sized synchronous nanowire-crossbar pipelines. Although four synchronous nanowire-crossbar pipeline computational stages are shown in FIG. 16, many more synchronous nanowire-crossbar pipeline computational stages may be interconnected in a synchronous nanowire-crossbar pipeline.

Figure 17:
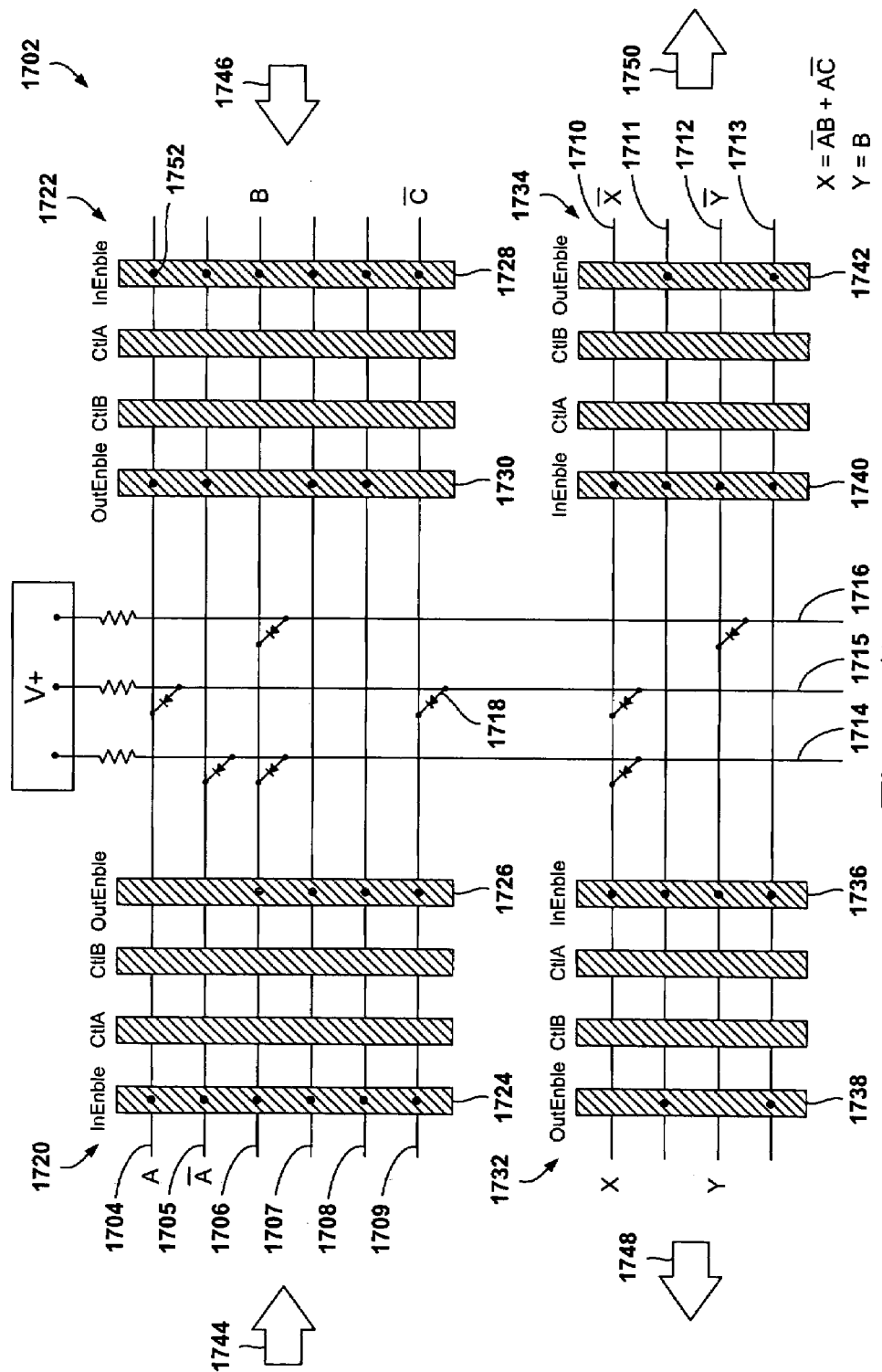
FIG. 17 illustrates an exemplary synchronous nanowire-crossbar state machine computational stage that represents one embodiment of the present invention.

Various embodiments of the present invention are directed to implementing synchronous nanowire-crossbar state machines from nanowire-crossbar-based logic arrays, latch arrays, and switch arrays. FIG. 17 illustrates an exemplary synchronous nanowire-crossbar state machine computational stage that represents one embodiment of the present invention. Synchronous nanowire-crossbar state machine computational stage 1702 includes six logic-array input lines 1704-1709, four logic-array input lines 1710-1713, and three internal signal lines 1714-1716 interconnected with logic-array input lines 1704-1709 and logic-array output lines 1710-1713 through diodes, such as diode 1718.

Signals input to logic-array input lines 1704-1709 are stored in one of two non-inverting input nanowire-crossbar latch arrays 1720 and 1722, depending on the transmission direction of the incoming signal in the logic-array input lines. Non-inverting input nanowire-crossbar latch array 1720 includes two enable lines, InEnable 1724 and OutEnable 1726. Non-inverting input nanowire-crossbar latch array 1722 also includes two enable lines, InEnable 1728 and OutEnable 1730. Signals output in logic-array output lines 1710-1713 are stored in one, or both, of two output nanowire-crossbar latch arrays, non-inverting output nanowire-crossbar latch array 1732 and inverting output nanowire-crossbar latch array 1734. Non-inverting output nanowire-crossbar latch array 1732 includes two enable lines, InEnable 1736 and OutEnable 1738. Inverting output nanowire-crossbar latch array 1734 also includes two enable lines, InEnable 1740 and OutEnable 1742. Input arrows 1744 and 1746, pointing towards logic-array input lines 1704-1709, represent input-signal transmission to synchronous nanowire-crossbar state machine computational stage 1702 and output arrows 1748 and 1750, pointing away from logic-array output lines 1710-1713, represent output-signal transmission from synchronous nanowire-crossbar state machine computational stage 1702.

A filled circle at an enable-line/signal-line intersection, such as filled circle 1752, indicates that the nanowire junction at the enable-line/signal-line is an FET. An unmarked enable-line/signal-line intersection indicates that the nanowire junction at the enable-line/signal-line is a high resistance nanowire junction. In FIG. 17, each nanowire junction connected to each InEnable is an FET, while a portion of the nanowire junctions connected to each OutEnable are FETs and a portion of the nanowire junctions connected to each OutEnable are high resistance nanowire junctions. Constant application of voltage $V_{disable}$ to each OutEnable disables signal transmission in signal lines interconnected by an FET and does not affect signal transmission in signal lines interconnected by a high resistance nanowire junction.

For example, in FIG. 17, OutEnables 1720 and 1722 control signal transmissions into synchronous nanowire-crossbar state machine computational stage 1702. OutEnable 1726 has FETs connected to logic-array input lines 1706-1709 that disable input-signal transmission in logic-array input lines 1706-1709 through nanowire-crossbar latch array 1720. OutEnable 1722 has FETs connected to logic-array input lines 1704, 1705, 1707, and 1708 that disable input-signal transmission in logic-array input lines 1704, 1705, 1707, and 1708 through nanowire-crossbar latch array 1722. Consequently, input signals in logic-array input lines 1704 and 1705 enter synchronous nanowire-crossbar state machine computational stage 1702 from the input direction specified by input arrow 1744, input signals in logic-array input lines 1706 and 1709 enter synchronous nanowire-crossbar state machine computational stage 1702 from the input direction specified by input arrow 1746, and input signals in logic-array input lines 1707 and 1708 do not enter synchronous nanowire-crossbar state machine computational stage 1702 from either direction.

OutEnable lines 1738 and 1742 control signal transmission out of synchronous nanowire-crossbar state machine computational stage 1702. In FIG. 17, OutEnable lines 1738 and 1742 each have FETs connected to logic-array output lines 1711 and 1713 that disable signal transmission in logic-array output lines 1711 and 1713 in either direction. Logic-array output lines 1710 and 1712 transmit signals in both output directions specified by output arrows 1748 and 1750. Signals transmitting to the left are stored in non-inverting output nanowire-crossbar latch array 1732 and output, during the next clock cycle, as restored-strength signals. Signals transmitting to the right are stored in inverting output nanowire-crossbar latch array 1734 and output, during the next clock cycle, as restored-strength, inverted signals.

Selective placement of interconnecting diodes between the internal signal lines and logic-array input lines, and between internal signal lines and logic-array output lines, produces the desired logic. In the exemplary synchronous nanowire-crossbar state machine computational stage of FIG. 17, logic-array output line 1710 receives signals $\overline{A}B$ and $A\overline{C}$ and outputs signal X, which is equal to $\overline{A}B+A\overline{C}$. Logic-array output line 1712 receives signal B and outputs signal Y, which is equal to B. Logic-array output lines 1710 and 1712 transmit signals X and Y, respectively, to the left and to the right. When output signals X and Y transmit to the left, output signals X and Y are stored in non-inverting nanowire-crossbar latch array 1732, and restored-strength X and Y signals are output from synchronous nanowire-crossbar state machine computational stage 1902 during the next clock cycle. When output signals X and Y transmit to the right, output signals X and Y are stored in inverting nanowire-crossbar latch array 1734, and restored-strength, inverted signals $\overline{X}$ and $\overline{Y}$ are output from synchronous nanowire-crossbar state machine computational stage 1702 during the next clock cycle. Note that output signals are not transmitted in logic-array output lines 1711 and 1713, because there are no diodes interconnecting internal signal lines to logic-array output lines 1711 and 1713. Moreover, FETs are positioned at signal-line/OutputEnable intersections between logic-array output lines 1711 and 1713 and OutputEnables 1752 and 1756 to disable signal transmission in logic-array output lines 1711 and 1713.

Signals are synchronously transmitted into and out of synchronous nanowire-crossbar state machine computational stage 1702. Each nanowire-crossbar latch array 1720, 1722, 1732, and 1734 is timed to simultaneously transition states, with the input nanowire-crossbar latch arrays (1720 and 1722 in FIG. 17) 180° out of phase from output nanowire-crossbar latch arrays 1732 and 1734. For example, during a first clock cycle, signals input to synchronous nanowire-crossbar state machine computational stage 1702 are stored into input nanowire-crossbar latch arrays 1720 and 1722 while stored signals in output nanowire-crossbar latch arrays 1732 and 1734 are output from synchronous nanowire-crossbar state machine computational stage 1702. During a second clock cycle, stored signals in input nanowire-crossbar latch arrays 1720 and 1722 are output to the nanowire-crossbar logic array and stored in output nanowire-crossbar latch arrays 1732 and 1734. During a third clock cycle, stored signals in output nanowire-crossbar latch arrays 1732 and 1734 are output from synchronous nanowire-crossbar state machine computational stage 1702 while new signals are input into input nanowire-crossbar logic arrays 1720 and 1722.

Figure 18:
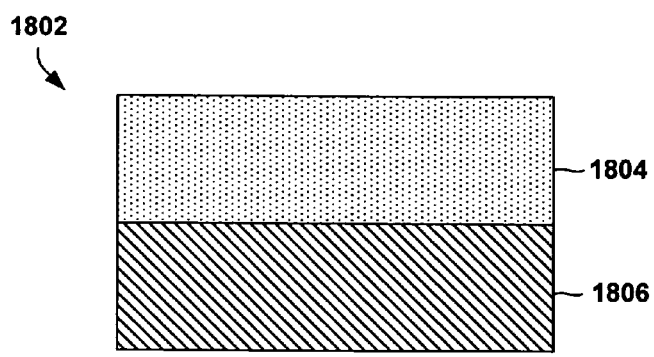
FIG. 18 is a symbolic representation of the exemplary synchronous nanowire-crossbar state machine computational stage of FIG. 17 that represents one embodiment of the present invention.

FIG. 18 is a symbolic representation of the exemplary synchronous nanowire-crossbar state machine computational stage of FIG. 17 that represents one embodiment of the present invention. Subsequent figures utilize the same symbolic representation. In FIG. 18, synchronous nanowire-crossbar state machine computational stage 1802 is divided into input signal region 1804, represented by a dotted rectangle, and output signal region 1806, represented by a cross-hatched rectangle below input signal region 1804. Signals are input into synchronous nanowire-crossbar state machine computational stage 1802 via input signal region 1804 and output from synchronous nanowire-crossbar state machine computational stage 1802 via output signal region 1806. Note that signals can be input and output from either the left and/or the right. Also note that, although not shown by the exemplary symbolic representation of the exemplary synchronous nanowire-crossbar state machine computational stage, input nanowire-crossbar latch arrays are included in input signal region 1804 and output nanowire-crossbar latch arrays are included in output signal region 1806.

Figure 19:
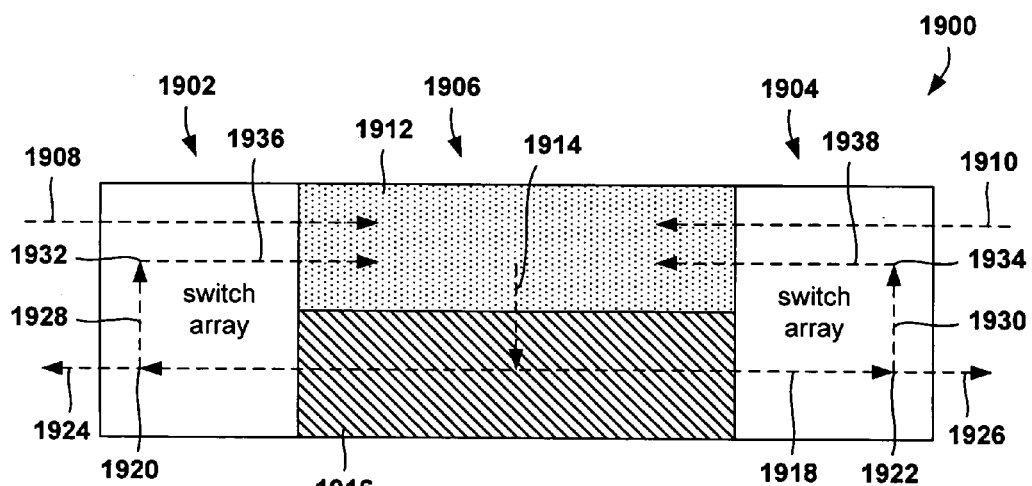
FIG. 19 illustrates a synchronous nanowire-crossbar state machine computational stage combined with two nanowire-crossbar switch arrays to form an exemplary synchronous nanowire-crossbar state machine that represents one embodiment of the present invention.

Nanowire-crossbar switch arrays can be interconnected with the input and output signal lines of synchronous nanowire-crossbar state machine computational stages to form synchronous nanowire-crossbar state machines. FIG. 19 illustrates a synchronous nanowire-crossbar state machine computational stage combined with two nanowire-crossbar switch arrays to form an exemplary synchronous nanowire-crossbar state machine that represents one embodiment of the present invention. Synchronous nanowire-crossbar state machine 1900 includes two nanowire-crossbar switch arrays 1902 and 1904, shown as unfilled rectangles, connected to synchronous nanowire-crossbar state machine computational stage 1906. Nanowire-crossbar switch arrays 1902 and 1904 route signals output from synchronous nanowire-crossbar state machine computational stage 1906 back into synchronous nanowire-crossbar state machine computational stage 1906 and also route signals output from synchronous nanowire-crossbar state machine 1900 to external devices. Dashed lines with arrowheads represent the direction of signal transmission within synchronous nanowire-crossbar state machine computational stage 1900. Dashed lines 1908 and 1910 represent signals transmitting, via input signal lines, into input signal region 1912 from external devices. Dashed line 1914 represents signals, transmitted in internal signal lines within the nanowire-crossbar logic array, from input signal region 1912 to output signal region 1916. Two-headed dashed line 1918 represents signals transmitted, in logic-array output lines, out of the synchronous nanowire-crossbar state machine computational stage 1906 and into nanowire-crossbar switch arrays 1902 and 1904. Branch-points 1920 and 1922 represent switches, in nanowire-crossbar switch arrays 1902 and 1904, where output signals either continue out of synchronous nanowire-crossbar state machine 1900, as shown by dashed lines 1924 and 1926, representing output signal lines, or are routed back into input signal region 1912, via vertical dashed lines 1928 and 1930, switches 1932 and 1934, and logic-array input lines 1936 and 1938.

Figure 20:
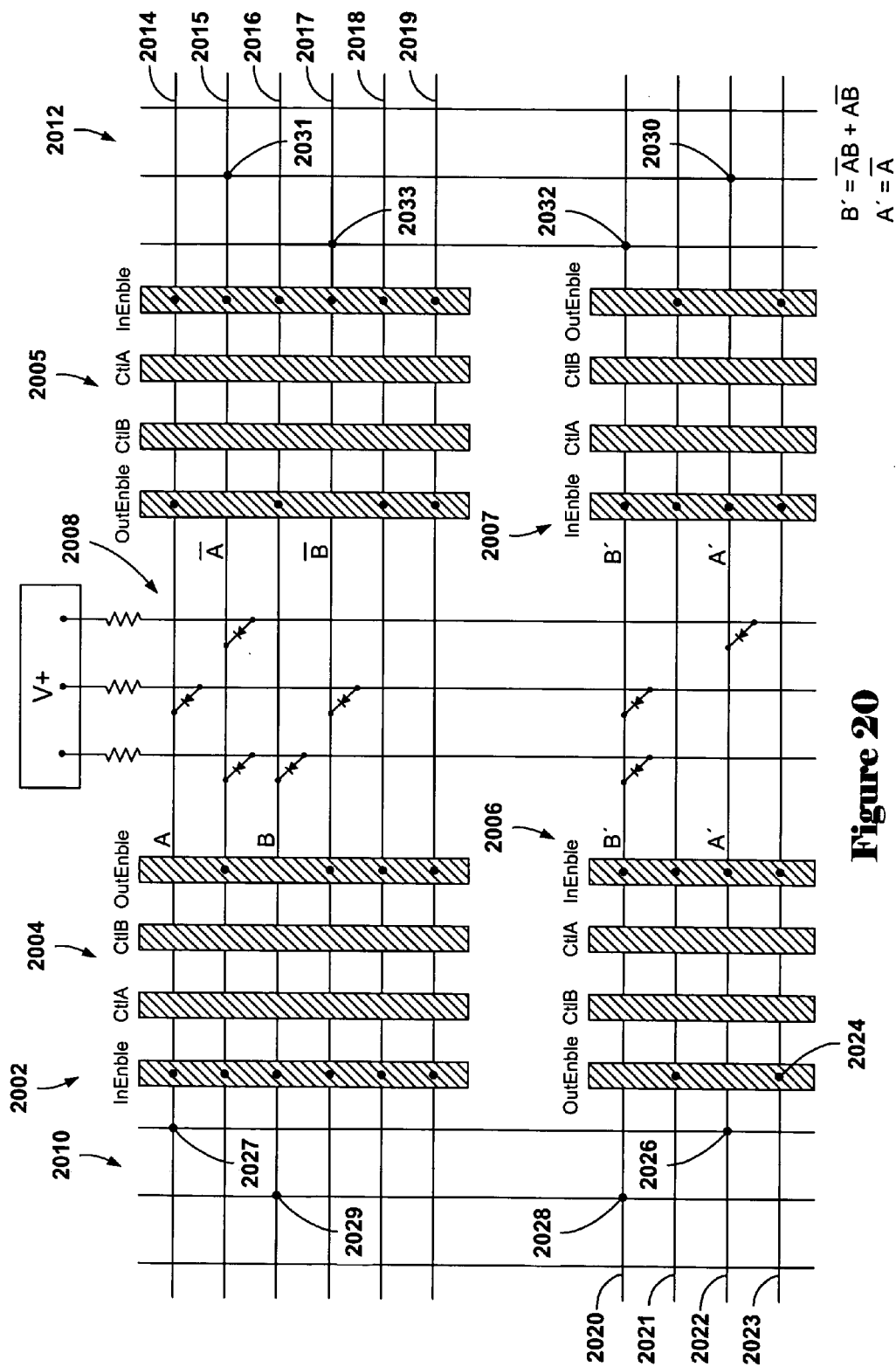
FIG. 20 illustrates an exemplary two-bit binary counter constructed from a synchronous nanowire-crossbar state machine that represents one embodiment of the present invention.

FIG. 20 illustrates an exemplary two-bit binary counter constructed from a synchronous nanowire-crossbar state machine that represents one embodiment of the present invention. Two-bit binary counter 2002 includes two non-inverting input nanowire-crossbar latch arrays 2004 and 2005, and two output nanowire-crossbar latch arrays, non-inverting output nanowire-crossbar latch array 2006, and inverting output nanowire-crossbar latch array 2007. Each nanowire-crossbar latch array is connected to nanowire-crossbar logic array 2008. Two nanowire-crossbar switch arrays 2010 and 2012 interconnect input nanowire-crossbar latch array 2004 to output nanowire-crossbar latch array 2006 and interconnect input nanowire-crossbar latch array 2005 to output nanowire-crossbar latch array 2007, respectively. Two-bit binary counter 2002 also includes six logic-array input lines 2014-2019 and four logic-array output lines 2020-2023 that transmit signals into and out of the nanowire-crossbar-based latch arrays, switch arrays, and logic array.

Signals A and B are input from the left, and input signals $\overline{A}$ and $\overline{B}$ are input from the right, and any input signals in logic-array input lines 2018 and 2019 are disabled in both directions. Logic-array output signal lines 2020 and 2022 transmit signals in both directions while logic-array output lines 2021 and 2023 are disabled in both directions. During a first clock cycle, for example, input signals A and B are output from nanowire-crossbar latch array 2004 and enter nanowire-crossbar logic array 2008 in logic-array input lines 2014 and 2016, respectively. At the same time, input signals $\overline{A}$ and $\overline{B}$ are output from nanowire-crossbar latch array 2005 and enter nanowire-crossbar logic array 2008 in logic-array input lines 2015 and 2017, respectively. The input signals pass through specifically-positioned diodes in nanowire-crossbar logic array 2008 to transform into signal A', which is equal to $\overline{A}$, on logic-array output line 2022 and signal B', which is equal to $\overline{A}B+A\overline{B}$, on logic-array output line 2020. Signals A' and B' are transmitted into non-inverting output nanowire-crossbar latch array 2006 and inverting output nanowire-crossbar latch array 2007 for storage.

During a second clock cycle, signals A' and B' are output from non-inverting output nanowire-crossbar latch array 2006 and inverting output nanowire-crossbar latch array 2007. Signals output from non-inverting nanowire-crossbar output latch array 2006 pass into nanowire-crossbar switch array 2010. When signal A' transmits into nanowire-crossbar switch array 2010, signal A' encounters a branch-point at switch 2026, with two available directions of signal-transmission, depending on whether switch 2026 is in an open position or a closed position. If switch 2026 is in an open position, then signal A' passes out of two-bit binary counter 2002. If switch 2026 is in a closed position, then signal A' passes across switch 2026 and across switch 2027 (assuming switch 2027 is in a closed position) to logic-array input line 2014 and into non-inverting input nanowire-crossbar latch array 2004 for storage. Similarly, when signal B' passes into nanowire-crossbar switch array 2010, signal B' encounters a branch-point at switch 2028, with two available directions of signal-transmission, depending on whether switch 2028 is in an open position or a closed position. If switch 2028 is in an open position, then signal B' passes out of two-bit binary counter 2002. If switch 2028 is in a closed position, then signal B' passes across switch 2028 and across switch 2029 (assuming switch 2029 is in a closed position) to logic-array input line 2016 and into non-inverting input nanowire-crossbar latch array 2004 for storage. Note that, whether switches are in an open position or a closed position is determined by voltage drops between interconnected nanowires. Switch positioning can be changed by application of voltages to interconnecting nanowires to create voltage drops that exceed voltage-opening and voltage-closing thresholds.

Signals output from inverting output nanowire-crossbar latch array 2007 pass into nanowire-crossbar switch array 2012. When signal A' passes into nanowire-crossbar switch array 2012, signal A' encounters a branch-point at switch 2030, with two available directions of signal-transmission, depending on whether switch 2030 is in an open position or a closed position. If switch 2030 is in an open position, then signal A' passes out of two-bit binary counter 2002. If switch 2030 is in a closed position, then signal A' passes across switch 2030 and across switch 2031 (assuming switch 2031 is in a closed position) to logic-array input line 2015 and into non-inverting input nanowire-crossbar latch array 2005 for storage. Similarly, when signal B' passes into nanowire-crossbar switch array 2012, signal B' encounters a branch-point at switch 2032, with two available directions of signal-transmission, depending on whether switch 2032 is in an open position or a closed position. If switch 2032 is in an open position, then signal B' passes out of two-bit binary counter 2002. If switch 2032 is in a closed position, then signal B' passes across switch 2032 and across switch 2033 (assuming switch 2033 is in a closed position) to logic-array input line 2017 and into non-inverting input nanowire-crossbar latch array 2005 for storage. Note that when signals A' and B' are output from inverting output nanowire-crossbar latch array 2007, signals A' and B' are inverted so that signal A' becomes equal to the inverse of $\overline{A}$, or A, and signal B' becomes equal to the inverse of $\overline{A}B+A\overline{B}$, which is also $\overline{A}B+A\overline{B}$.

Figure 21A:
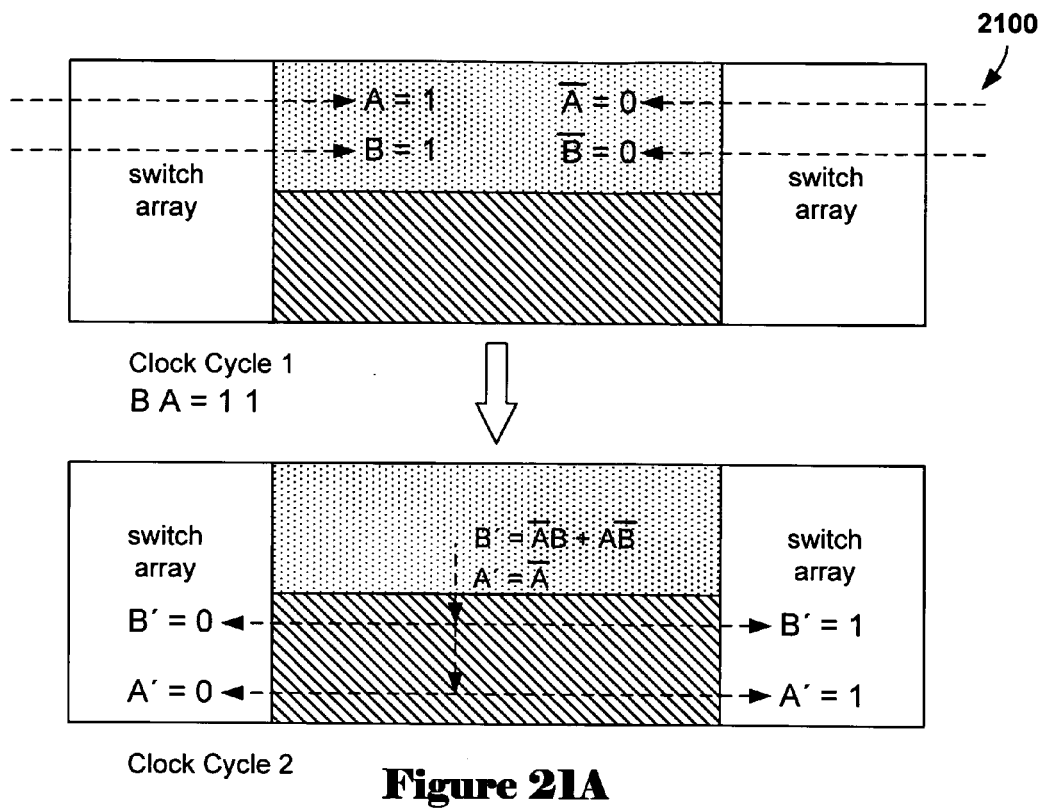
FIGS. 21A-21E show a symbolic representation of the two-bit binary counter of FIG. 20 progressing through consecutive states.
Figure 21B:
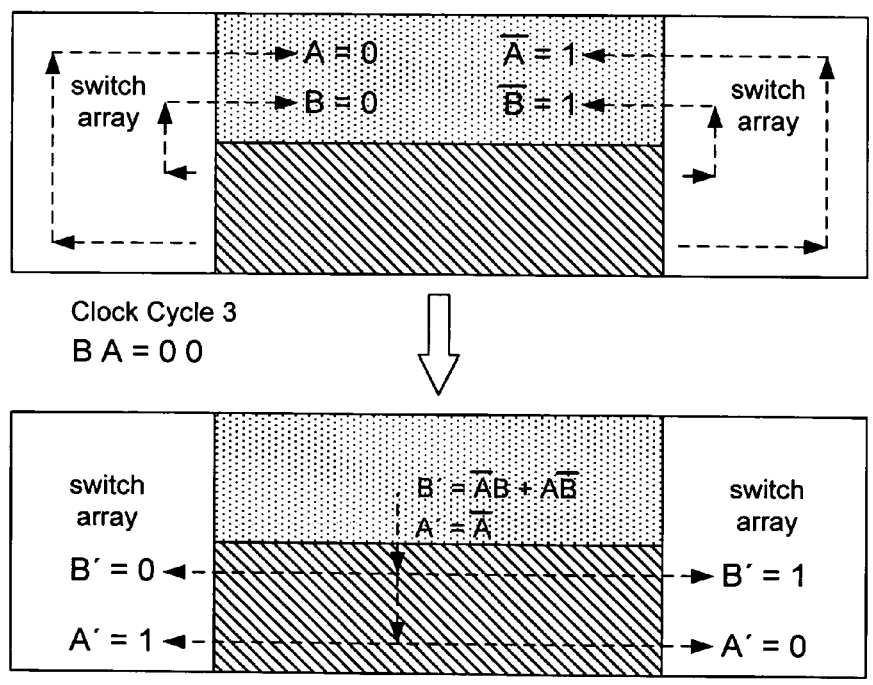
Figure 21C:
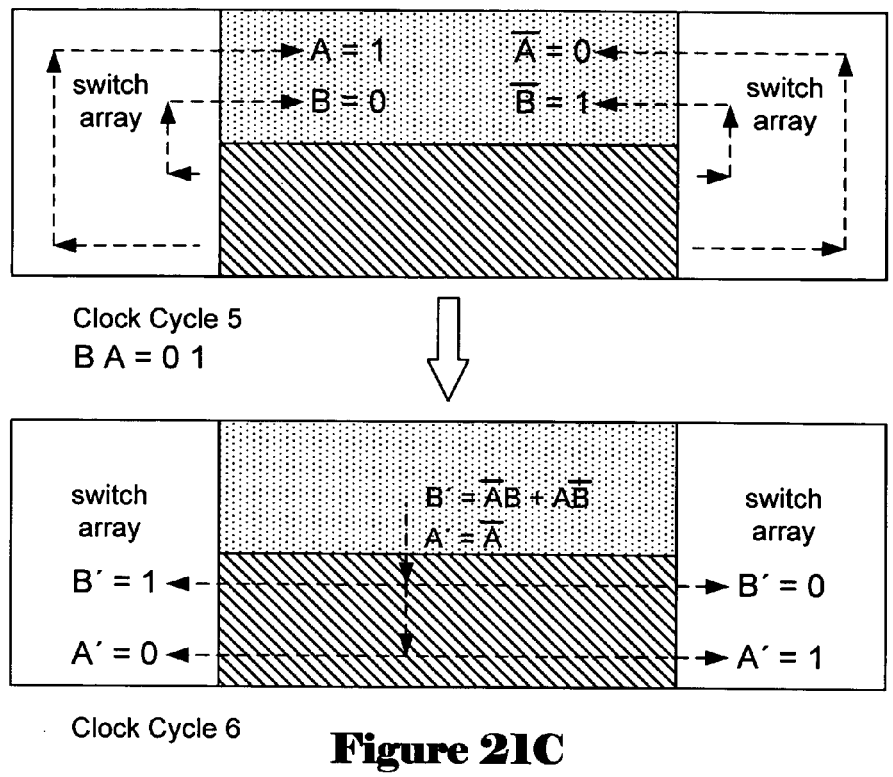
Figure 21D:
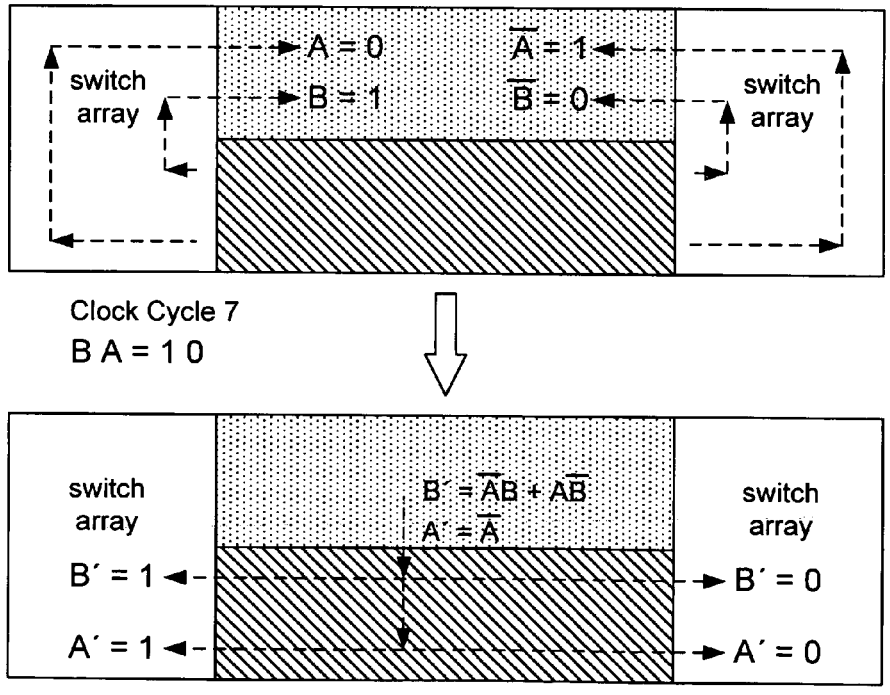
Figure 21E:
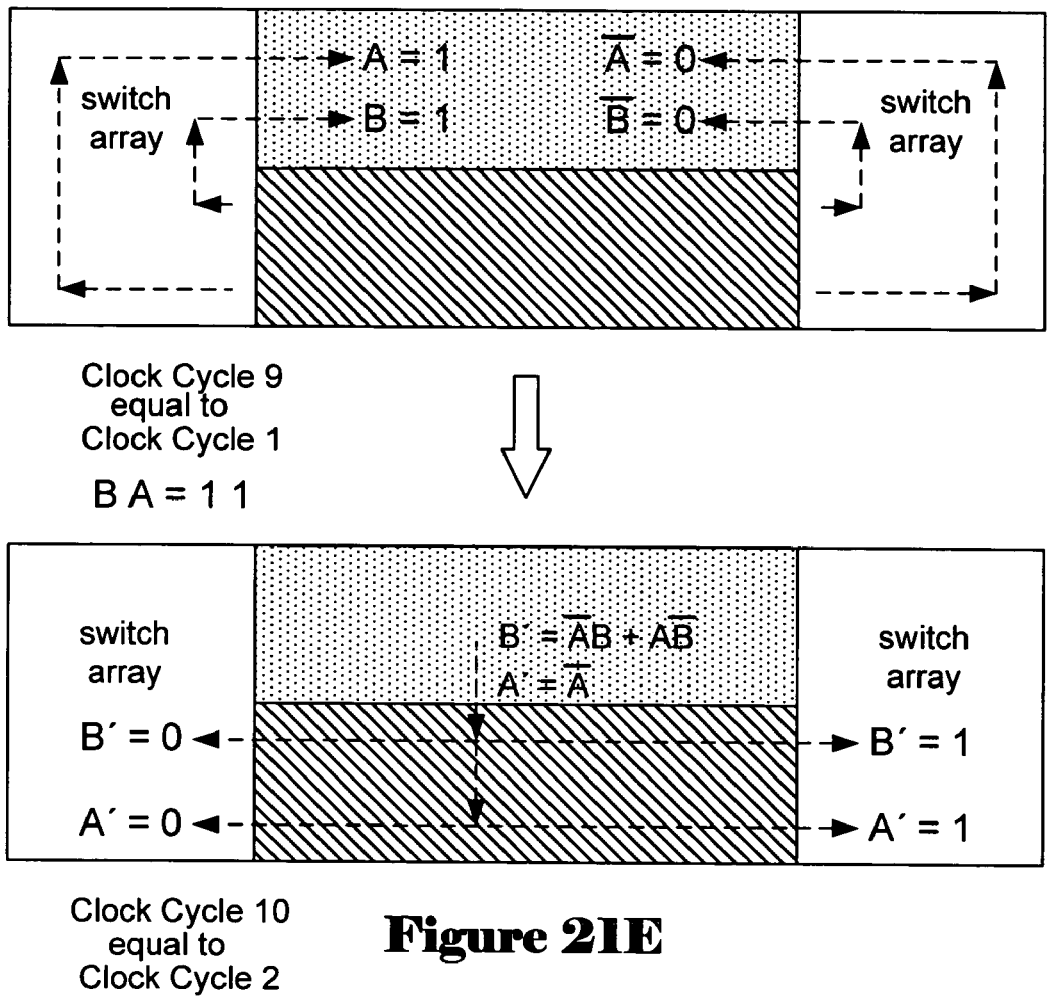

If the values of input signals, or bits, A and B were monitored on a two-digit display, with bit B, representing the most significant bit, and bit A, representing the least significant bit, then the display would show bits A and B progressing through consecutive states in a synchronous manner during consecutive two-clock-cycle intervals, cycling through the four states "00," "01," "10," and "11." FIGS. 21A-21E show a symbolic representation of the two-bit binary counter of FIG. 20 progressing through consecutive states. FIG. 21A shows two-bit binary counter 2100 receiving four signals, represented by dashed lines with arrowheads to show direction of movement, from external devices. During a first clock cycle, the first two signals, A=1 and B=1, are shown output from input nanowire-crossbar latch array (2004 in FIG. 20), and the two complementary signals $\overline{A}$=0 and $\overline{B}$=0, are shown output from input nanowire-crossbar latch array (2005 in FIG. 20). BA is equal to "11." During a second clock cycle, output signals A' and B' are output from output nanowire-crossbar latch arrays (2006 and 2007 in FIG. 20). In FIG. 21B, output signals A' and B' are routed back to input nanowire-crossbar latch arrays (2004 and 2005 in FIG. 20) during a third clock cycle, and are shown as signals A and B are output from input nanowire-crossbar arrays (2004 and 2005 in FIG. 20). BA is equal to "00." During a fourth clock cycle, output signals A' and B' are output from output nanowire-crossbar latch arrays (2006 and 2007 in FIG. 20). As shown in FIGS. 21C-21E, every two clock cycles, BA transforms to the next state in the four-state cycle. Thus, two-bit binary counter 2100 cycles through the four states: "00," "01," "10," and "10" every two clock cycles.

Figure 22:
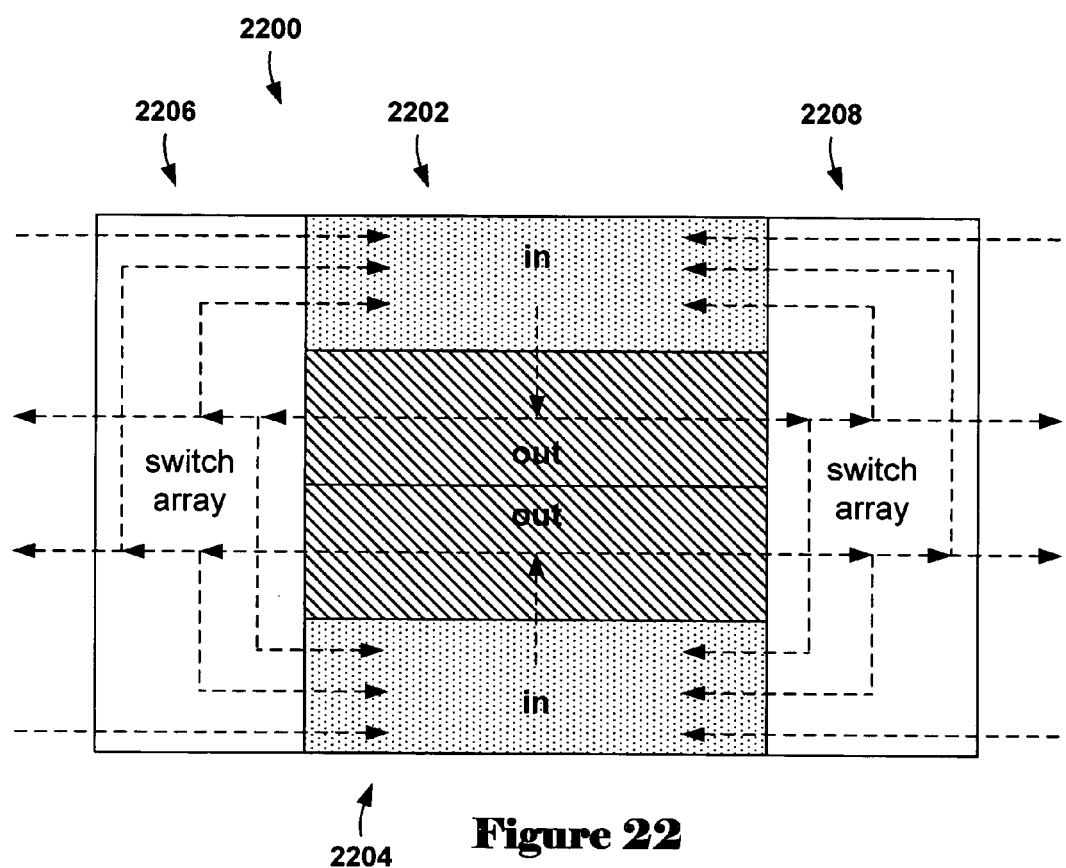
FIG. 22 illustrates two synchronous nanowire-crossbar state machine computational stages connected by two nanowire-crossbar switch arrays to form an exemplary synchronous nanowire-crossbar state machine that represents one embodiment of the present invention.

Larger state machines can be fabricated by interconnecting multiple synchronous nanowire-crossbar state machine computational stages into various configurations with nanowire-crossbar switch arrays distributed to allow for signal transmission between many different synchronous nanowire-crossbar state machine computational stages in many possible different orders. FIG. 22 illustrates two synchronous nanowire-crossbar state machine computational stages connected by two nanowire-crossbar switch arrays to form an exemplary synchronous nanowire-crossbar state machine that represents one embodiment of the present invention. Synchronous nanowire-crossbar state machine 2200 includes two synchronous nanowire-crossbar state machine computational stages 2202 and 2204 connected to nanowire-crossbar switch arrays 2206 and 2208. Dashed lines with arrowheads represent some possible directions of signal transmission into, within, and out of synchronous nanowire-crossbar state machine 2200.

Figure 23:
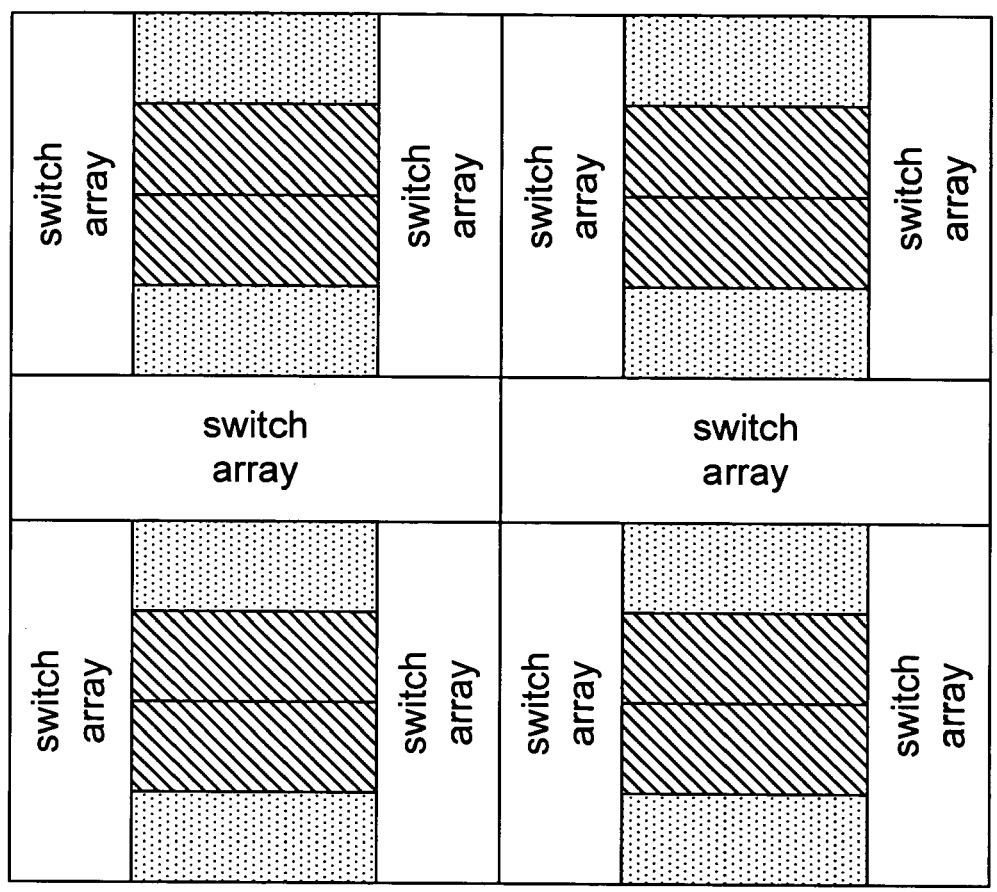
FIG. 23 illustrates eight synchronous nanowire-crossbar state machine computational stages connected by eight nanowire-crossbar switch arrays to form an exemplary synchronous nanowire-crossbar state machine that represents one embodiment of the present invention.

FIG. 23 illustrates eight synchronous nanowire-crossbar state machine computational stages connected by eight nanowire-crossbar switch arrays to form an exemplary synchronous nanowire-crossbar state machine that represents one embodiment of the present invention. In FIG. 23, additional synchronous nanowire-crossbar state machine computational stages and nanowire-crossbar switch arrays are shown connected together. Additional synchronous nanowire-crossbar state machine computational stages and nanowire-crossbar switch arrays can be interconnected in a limitless number of ways to create larger, and more complex, synchronous nanowire-crossbar state machines. The number of synchronous nanowire-crossbar state machine computational stages implemented into a circuit to undertake a particular computation, can range from one synchronous nanowire-crossbar state machine computational stage to hundreds of synchronous nanowire-crossbar state machine computational stages, or even thousands of synchronous nanowire-crossbar state machine computational stages.

Various methods currently exist for retiming synchronous nanowire-crossbar state machines to enhance performance, such as retiming synchronous nanowire-crossbar state machines to minimize the number of clock periods needed to perform operations. Synchronous nanowire-crossbar state machines can be retimed by moving nanowire-crossbar latch arrays, while maintaining the primary inputs and outputs and latency of the synchronous nanowire-crossbar state machine. Previous studies have shown that feedback loops can be a limiting factor in retiming synchronous nanowire-crossbar state machines.

The sum of the propagation delays through all of the operations in a feedback loop divided by the number of nanowire-crossbar latch arrays on the feedback loop is referred to as the "average weight" of a feedback loop. The clock period of a retimed synchronous nanowire-crossbar state machine cannot be less than the maximum average weight of any feedback loop within the synchronous nanowire-crossbar state machine. Situations can occur where the average weight of a feedback loop within a synchronous nanowire-crossbar state machine is greater than the desired propagation delay of the clock cycle. In that case, retiming cannot be performed because the minimum clock period cannot be less than the average weight cycle. However, a slowdown transformation of a synchronous nanowire-crossbar state machine can be performed on the synchronous nanowire-crossbar state machine.

For example, assume that it is desired to retime a synchronous nanowire-crossbar state machine so that during each clock cycle, there is only enough time to execute a single operation. However, the average weight of one or more of the feedback loops in the originally-timed synchronous nanowire-crossbar state machine has an average weight greater than one. In a slowdown transformation, each nanowire-crossbar latch array in the originally-timed circuit is replaced by a constant number c of nanowire-crossbar latch arrays, producing a c-slow synchronous nanowire-crossbar state machine. The resulting synchronous nanowire-crossbar state machine is then retimed to distribute the nanowire-crossbar latch arrays and minimize the clock period. An increased number of nanowire-crossbar latch arrays are now employed, each with a decreased clock period. As long as the maximum average-weight cycle ("MAWC") of the c-slow synchronous nanowire-crossbar state machine is less than, or equal to, one, the retimed c-slow synchronous nanowire-crossbar state machine will be able to execute operations with the desired clock period of one. However, the increased frequency of the retimed synchronous nanowire-crossbar state machine is offset by the reduced rate of input processing. The retimed synchronous nanowire-crossbar state machine inputs and outputs usable values during 1-out-of-c clock cycles, and inputs and outputs unusable values during the remaining clock cycles.

Figure 24:
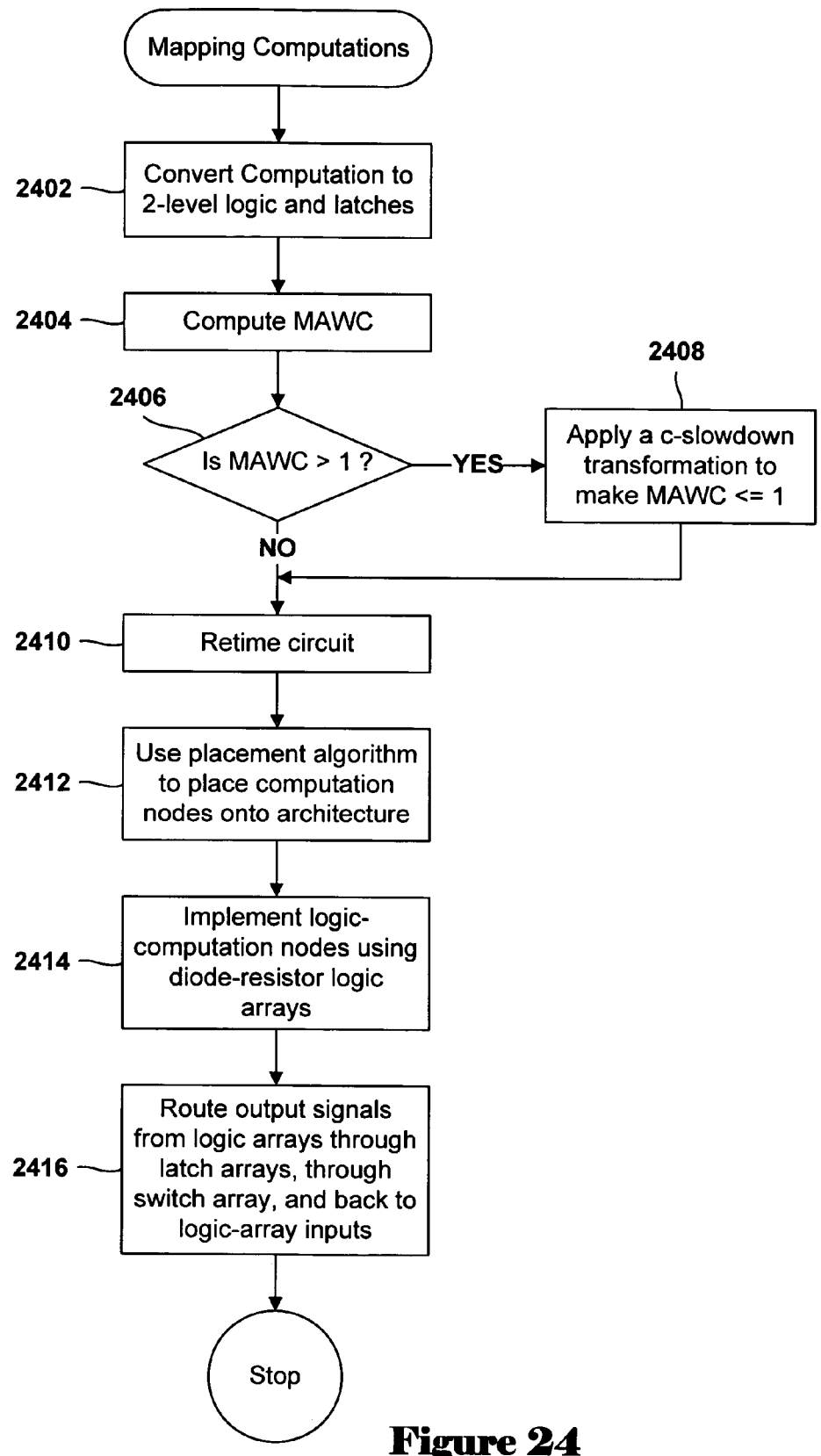
FIG. 24 is a control-flow diagram that represents one of many possible methods for mapping an arbitrary computation, with feedback, onto a synchronous nanowire-crossbar state machine.

FIG. 24 is a control-flow diagram that represents one of many possible methods for mapping an arbitrary computation, with feedback, onto a synchronous nanowire-crossbar state machine. In step 2402, the computation is converted to 2-level nanowire-crossbar logic arrays and nanowire-crossbar latch arrays using standard logic synthesis software. Each 2-level logic function represents a single computation node in a computation graph, with data flow representing the edges of the computation graph, and each node having equal latency. In step 2404, the MAWC of the computation graph is computed. In step 2406, if the MAWC is greater than one, then, in step 2408, a c-slowdown transformation is applied to reduce the MAWC to a number less than, or equal to, one. Once the MAWC is less than, or equal to one, in step 2410, the synchronous nanowire-crossbar state machine can be retimed so that there is one or fewer computation nodes in sequence between nanowire-crossbar latch arrays. In step 2412, the computation nodes are placed onto the nanowire-crossbar network using a placement algorithm, such as simulated annealing. In step 2414 the logic-computation nodes are implemented, using diode-resistor, nanowire-junction logic arrays. In step 2416, signals are routed out of a nanowire-crossbar logic array, via one or two output nanowire-crossbar latch arrays, and onto a nanowire-crossbar switch array. The signals are then routed into a nanowire-crossbar logic array via an input nanowire-crossbar latch array. Generally, there are three routing choices for each signal output from a nanowire-crossbar logic array: (1) routing the output signal through the non-inverting output nanowire-crossbar latch array only; (2) routing the output signal through the inverting output nanowire-crossbar latch array only; or (3) routing the output signal through both the non-inverting output nanowire-crossbar latch array and the inverting nanowire-crossbar latch array. The choice of which route to take may depend on whether or not subsequent use of each output signal will be in true, inverted, or both true and inverted form.

Although the present invention has been described in terms of a particular embodiment, it is not intended that the invention be limited to this embodiment. Modifications within the spirit of the invention will be apparent to those skilled in the art. For example, synchronous nanowire-crossbar pipeline computational stages were shown employing nanowire-crossbar latch arrays without OutEnable lines and synchronous nanowire-crossbar state machine computational stages were shown employing nanowire-crossbar latch arrays with OutEnable lines. Either type of nanowire-crossbar latch array can be employed by either type of synchronous nanowire-crossbar computational stage. The sizing of each nanowire-crossbar logic array can be modified to incorporate variable numbers of input signal lines, logic-array input lines, signal output lines, logic-array output lines, and internal signal lines. Although diode-resistor-based logic-implementing devices were described, other types of logic-implementing devices can be used as well, such as field-effect transistors. Devices can also be created which combine synchronous nanowire-crossbar pipeline computational stages and synchronous nanowire-crossbar state machine computational stages.

The foregoing detailed description, for purposes of illustration, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description; they are not intended to be exhaustive or to limit the invention to the precise forms disclosed. Obviously many modifications and variation are possible in view of the above teachings. The embodiments were chosen and described in order to best explain the principles of the invention and its practical applications and to thereby enable others skilled in the art to best utilize the invention and various embodiments with various modifications as are suited to the particular use contemplated.

The invention claimed is:

1. A nanoscale computational stage comprising:
   a nanoscale logic array formed by interconnections between a number of internal signal lines, a number of logic-array input lines, and a number of logic-array output lines; and
   a number of nanoscale latch arrays interconnected with the nanoscale logic array, wherein each nanoscale latch array includes at least one enable line, a first control line, and a second control line that are selectively interconnected with the logic-array output lines and/or the logic-array input lines.

2. The nanoscale computational stage of claim 1 wherein the nanoscale latch arrays interconnected with the nanoscale logic array include output nanoscale latch arrays that interconnect with selected logic-array output lines.

3. The nanoscale computational stage of claim 1 wherein the nanoscale latch array lines selectively interconnected with logic-array output lines further comprises:
   the at least one enable line crossing each logic-array output line, the at least one enable line interconnected to each logic-array output line by a field-effect transistor, the at least one enable line controlling signal transmission out of the nanoscale logic array;
   the first control line crossing each logic-array output line, the first control line interconnected to each logic-array output line by an asymmetric switch; and the second control line crossing each logic-array output line, the second control line interconnected to each logic-array output line by an asymmetric switch.

4. The nanoscale computational stage of claim 3 wherein the at least one enable line further comprise a second enable line crossing each logic-array output line, the second enable line interconnected to each logic-array output line by one of:
   a field-effect transistor; and
   a high resistance nanowire junction.

5. The nanoscale computational stage of claim 2 wherein at least one of the output nanoscale latch arrays is a non-inverting output nanoscale latch array and at least one of the nanoscale latch arrays is an inverting output nanoscale latch array.

6. The nanoscale computational stage of claim 5 wherein the nanoscale latch arrays interconnected with the nanoscale logic array further include input nanoscale latch arrays that interconnect with selected logic-array input lines.

7. The nanoscale computational stage of claim 1 wherein the nanoscale latch array lines selectively interconnected with logic-array input lines further comprises:
   the at least one enable line crossing each logic-array input line, the at least one enable line interconnected to each logic-array input line by a field-effect transistor, the at least one enable line controlling signal transmission into the nanoscale logic array;
   the first control line crossing each logic-array input line, the first control line interconnected to each logic-array input line by an asymmetric switch; and
   the second control line crossing each logic-array input line, the second control line interconnected to each logic-array input line by an asymmetric switch.

8. The nanoscale computational stage of claim 7 wherein the at least one enable line further comprise a second enable line crossing each logic-array input line, the second enable line interconnected to each logic-array input line by one of:
   a field-effect transistor; and
   a high resistance nanowire junction.

9. The nanoscale computational stage of claim 6 wherein the input nanoscale latch arrays are non-inverting input nanoscale latch arrays.

10. The nanoscale computational stage of claim 1 wherein the interconnections between the number of internal signal lines, the number of logic-array input lines, and the number of logic-array output lines are diodes.

11. A nanoscale computing circuit comprising:
   a number of input signal lines;
   a number of output signal lines;
   a number of interconnected nanoscale computational stages, each nanoscale computational stage including
      a nanoscale logic array formed by interconnections between a number of internal signal lines, a number of logic-array input lines, and a number of logic-array output lines, and
      a number of nanoscale latch arrays, wherein each nanoscale latch array includes at least one enable line, a first control line, and a second control line that are selectively interconnected with the logic-array output lines and/or logic-array input lines.

12. The nanoscale computing circuit of claim 11 wherein nanoscale computational stages are interconnected by a number of nanoscale switch arrays.

13. The nanoscale computing circuit of claim 12 wherein nanoscale switch arrays interconnect with nanoscale computational stages by at least one of:
   selected logic-array input lines; and
   selected logic-array output lines.

14. The nanoscale computing circuit of claim 13 wherein the nanoscale computing circuit is a pipeline in which a number of nanoscale switch arrays interconnect logic-array input lines of a first nanoscale computational stage to logic-array output lines of a preceding nanoscale computational stage, and a number of nanoscale switch arrays interconnect logic-array output lines of a first nanoscale computational stage to logic-array input lines of a succeeding nanoscale computational stage.

15. The nanoscale computing circuit of claim 14 wherein the signals output from the preceding nanoscale computational stage cannot be a function of the signals output from the first nanoscale computational stage.

16. The nanoscale computing circuit of claim 11 wherein the nanoscale latch arrays interconnected with the nanoscale logic array include output nanoscale latch arrays that interconnect with selected logic-array output lines.

17. The nanoscale computing circuit of claim 11 wherein the nanoscale latch array selectively interconnected with the nanoscale logic-array lines in each nanoscale computational stage further comprises:
   the at least one enable line crossing each logic-array output line, the at least one enable line interconnected to each logic-array output line by a field-effect transistor, the at least one enable line controlling signal transmission out of the nanoscale logic array;
   the first control line crossing each logic-array output line, the first control line interconnected to each logic-array output line by an asymmetric switch; and
   the second control line crossing each logic-array output line, the second control line interconnected to each logic-array output line by an asymmetric switch.

18. The nanoscale computing circuit of claim 17 wherein at least one of the output nanoscale latch arrays is a non-inverting output nanoscale latch array and at least one of the nanoscale latch arrays is an inverting output nanoscale latch array.

19. The nanoscale computing circuit of claim 13 wherein the nanoscale computing circuit is a state machine in which a number of nanoscale switch arrays interconnect logic-array input lines of a first nanoscale computational stage to logic-array output lines of a preceding nanoscale computational stage, and a number of nanoscale switch arrays interconnect logic-array output lines of a first nanoscale computational stage to logic-array input lines of a succeeding nanoscale computational stage.

20. The nanoscale computing circuit of claim 19 wherein the signals output from the preceding nanoscale computational stage can be a function of the signals output from the first nanoscale computational stage.

21. The nanoscale computing circuit of claim 19 wherein the nanoscale latch arrays interconnected with the nanoscale logic array comprise:
   a number of input nanoscale latch arrays interconnected with selected logic-array input lines; and
   a number of output nanoscale latch arrays interconnected with selected logic-array output lines.

22. The nanoscale computing circuit of claim 21 wherein the input nanoscale latch arrays in each nanoscale computational stage include
   a first enable line crossing each logic-array input line, the first enable line interconnected to each logic-array input line by a field-effect transistor, the first enable line controlling signal transmission into the nanoscale logic array;

a first control line crossing each logic-array input line, the first control line interconnected to each logic-array input line by an asymmetric switch;

a second control line crossing each logic-array input line, the second control line interconnected to each logic-array input line by an asymmetric switch; and a second enable line crossing each logic-array input line, the second enable line interconnected to each logic-array input line, the second enable line also controlling signal transmission into the nanoscale logic array.

23. The nanoscale computing circuit of claim 22 wherein the second enable line is interconnected to each logic-array input line by one of:

a field-effect transistor; and a high resistance nanowire junction.

24. The nanoscale computing circuit of claim 23 wherein the input nanoscale latch arrays are non-inverting input nanoscale latch arrays.

25. The nanoscale computing circuit of claim 21 wherein the output nanoscale latch arrays for each nanoscale computational stage include a first enable line crossing each logic-array output line, the first enable line interconnected to each logic-array output line by a field-effect transistor, the first enable line controlling signal transmission out of the nanoscale logic array;

a first control line crossing each logic-array output line, the first control line interconnected to each logic-array output line by an asymmetric switch;

a second control line crossing each logic-array output line, the second control line interconnected to each logic-array output line by an asymmetric switch; and a second enable line crossing each logic-array output line, the second enable line interconnected to each logic-array output line, the second enable line also controlling signal transmission out of the nanoscale logic array.

26. The nanoscale computing circuit of claim 25 wherein the second enable line is interconnected to each logic-array output line by one of:

a field-effect transistor; and a high resistance nanowire junction.

27. The nanoscale computing circuit of claim 26 wherein at least one of the output nanoscale latch arrays is a non-inverting output nanoscale latch array and at least one of the nanoscale latch arrays is an inverting output nanoscale latch array.

28. The nanoscale computing circuit of claim 11 wherein the interconnections between the number of internal signal lines, the number of logic-array input lines, and the number of logic-array output lines within each nanoscale computational stage are diodes.

29. A synchronous nanoscale computing circuit comprising:

a number of input signal lines;

a number of output signal lines;

a number of interconnected synchronous nanoscale computational stages, each synchronous nanoscale computational stage including a nanoscale logic array formed from the input signal lines and the output signal lines, and a number of signal storing nanoscale latch arrays, wherein each nanoscale latch array includes at least one enable line, a first control line, and a second control line that are selectively interconnected with the output signal lines and/or the input signal lines of the nanoscale logic array.

30. The synchronous nanoscale computing circuit of claim 29 wherein each interconnected synchronous nanoscale computational stage performs a discrete stage of a multi-stage computation.

31. The synchronous nanoscale computing circuit of claim 29 wherein signals output from a signal storing nanoscale latch array are restored in strength to a value approximately equal to the signal strength of the signals entering the synchronous nanoscale computational stage.

32. The synchronous nanoscale computing circuit of claim 29 wherein the synchronous nanoscale computing circuit is a pipeline and the synchronous nanoscale computational stage is a synchronous pipeline nanoscale computational stage.

33. The synchronous nanoscale computing circuit of claim 29 wherein the synchronous nanoscale computing circuit is a state machine and the synchronous nanoscale computational stage is a synchronous state machine nanoscale computational stage.

34. A method for constructing a nanoscale circuit, the method comprising:

providing two or more nanoscale computational stages, each nanoscale computational stage including a nanoscale logic array formed by interconnections between a number of internal signal lines, a number of logic-array input lines, and a number of logic-array output lines, and a number of nanoscale latch arrays, wherein each nanoscale latch array includes at least one enable line, a first control line, and a second control line that are selectively interconnected with the number of logic-array output signal lines and/or selectively interconnected with the number of logic-array input signal lines; and interconnecting the nanoscale computational stages by a number of nanoscale switch arrays.

35. The method for constructing a nanoscale circuit of claim 34 wherein the nanoscale computing circuit is a pipeline in which a number of nanoscale switch arrays interconnect logic-array input lines of a first nanoscale computational stage to logic-array output lines of a preceding nanoscale computational stage, and a number of nanoscale switch arrays interconnect logic-array output lines of a first nanoscale computational stage to logic-array input lines of a succeeding nanoscale computational stage.

36. The method for constructing a nanoscale circuit of claim 34 wherein the nanoscale computing circuit is a state machine in which a number of nanoscale switch arrays interconnect logic-array input lines of a first nanoscale computational stage to logic-array output lines of a preceding nanoscale computational stage, and a number of nanoscale switch arrays interconnect logic-array output lines of a first nanoscale computational stage to logic-array input lines of a succeeding nanoscale computational stage.

* * * * *